United States Patent
Cao et al.

(10) Patent No.: US 9,997,778 B2
(45) Date of Patent: Jun. 12, 2018

(54) POLYCRYSTALLINE VANADIUM OXIDE NANOSHEETS

(71) Applicant: University of Washington through its Center for Commercialization, Seattle, WA (US)

(72) Inventors: Guozhong Cao, Seattle, WA (US); Yanwei Li, Guilin (CN)

(73) Assignee: University of Washington through its Center for Commercialization, Seattle, WA (US)

( * ) Notice: Subject to any disclaimer, the term of this patent is extended or adjusted under 35 U.S.C. 154(b) by 207 days.

(21) Appl. No.: 14/440,849

(22) PCT Filed: Nov. 5, 2013

(86) PCT No.: PCT/US2013/068561
§ 371 (c)(1),
(2) Date: May 5, 2015

(87) PCT Pub. No.: WO2014/071393
PCT Pub. Date: May 8, 2014

(65) Prior Publication Data

US 2015/0280232 A1    Oct. 1, 2015

Related U.S. Application Data

(60) Provisional application No. 61/722,709, filed on Nov. 5, 2012.

(51) Int. Cl.
*H01M 4/485* (2010.01)
*H01M 4/62* (2006.01)
(Continued)

(52) U.S. Cl.
CPC ............ *H01M 4/485* (2013.01); *C01G 31/02* (2013.01); *C30B 5/00* (2013.01); *C30B 5/02* (2013.01);
(Continued)

(58) Field of Classification Search
CPC  C30B 5/02; C30B 29/16; C30B 29/60; C30B 5/00; H01M 4/485; H01M 10/0525;
(Continued)

(56) References Cited

U.S. PATENT DOCUMENTS 5,334,334 A * 8/1994 Koksbang ............. C01G 31/00
264/28
5,674,642 A    10/1997 Le
(Continued)

FOREIGN PATENT DOCUMENTS

CN    1705152 A    12/2005
CN    101391816 A    3/2009
(Continued)

OTHER PUBLICATIONS

Zhao, D., et al., "Triblock Copolymer Syntheses of Mesoporous Silica With Periodic 50 to 300 Angstrom Pores," Science 279(5350):548-552, Jan. 1998.
(Continued)

*Primary Examiner* — Muhammad S Siddiquee
(74) *Attorney, Agent, or Firm* — Christensen O'Connor Johnson Kindness PLLC

(57) ABSTRACT

Improved $V_2O_5$ materials are disclosed herein in the form of 2D leaf-like nanosheets. Methods of forming the $V_2O_5$ nanosheets and batteries (e.g., lithium-ion) incorporating the $V_2O_5$ nanosheets are also provided.

6 Claims, 13 Drawing Sheets

(51) Int. Cl.
  C01G 31/02    (2006.01)
  C30B 5/02     (2006.01)
  C30B 29/16    (2006.01)
  C30B 29/60    (2006.01)
  H01M 10/0525  (2010.01)
  C30B 5/00     (2006.01)

(52) U.S. Cl.
  CPC .............. C30B 29/16 (2013.01); C30B 29/60 (2013.01); H01M 4/625 (2013.01); H01M 10/0525 (2013.01); C01P 2004/20 (2013.01); C01P 2006/12 (2013.01); C01P 2006/40 (2013.01); Y02T 10/7011 (2013.01)

(58) Field of Classification Search
  CPC .... H01M 4/625; C01G 31/02; Y02T 10/7011; C01P 2004/20; C01P 2006/12; C01P 2006/40
  See application file for complete search history.

(56) References Cited

U.S. PATENT DOCUMENTS

| | | | |
|---|---|---|---|
| 5,789,110 | A | 8/1998 | Saidi |
| 6,013,391 | A | 1/2000 | Le |
| 6,063,556 | A | 5/2000 | Valsecchi |
| 8,211,572 | B2 | 7/2012 | Cho |
| 8,309,242 | B2 | 11/2012 | Wei |
| 2002/0064497 | A1 | 5/2002 | Home et al. |
| 2005/0200935 | A1* | 9/2005 | Liu ............... C07D 493/04 359/265 |
| 2007/0286796 | A1 | 12/2007 | Koper |
| 2009/0117464 | A1 | 5/2009 | Cho et al. |
| 2009/0263724 | A1* | 10/2009 | Guyomard ............... B01J 23/22 429/305 |
| 2013/0101848 | A1* | 4/2013 | Banerjee .................. C09K 9/00 428/402 |
| 2013/0130115 | A1 | 5/2013 | Park |
| 2013/0163145 | A1 | 6/2013 | Deng |

FOREIGN PATENT DOCUMENTS

| | | |
|---|---|---|
| CN | 101691658 A | 4/2010 |
| EP | 1 460 700 A2 | 9/2004 |
| WO | 2008/021256 A2 | 2/2008 |
| WO | 2012/051619 A2 | 4/2012 |
| WO | 2013/048597 A2 | 4/2013 |

OTHER PUBLICATIONS

Zhitomirsky, I., "Cathodic Electrodeposition of Ceramic and Organoceramic Materials. Fundamental Aspects," Advances in Colloid and Interface Science 97(1-3):297-317, Mar. 2002.
Zhou, J., "Development of China Vanadium Industry," Vanadium International Technical Committee (Vanitec), <http://www.vanitec.org/pages/en/publications/publications.php> [retrieved May 22, 2015], 18 pages.
Zhou, W.-P., et al., "Enhancement in Ethanol Electrooxidation by SnO(x) Nanoislands Grown on Pt(111): Effect of Metal Oxide-Metal Interface Sites," Journal of Physical Chemistry C 115(33):16467-16473, Jul. 2011.
Zhou, Y., et al., "Preparation and Characterization of $V_2O_5$ Macro-Plates," Materials Letters 61(19-20):4073-4075, Aug. 2007.
Zukalová, M., et al., "Pseudocapacitive Lithium Storage in $TiO_2$(B)," Chemistry of Materials 17(5):1248-1255, Feb. 2005.
Abello, L., et al., "Vibrational-Spectra and Valence Force-Field of Crystalline $V_2O_5$," Spectrochimica Acta Part A: Molecular and Biomolecular Spectroscopy 39(7):641-651, Jul. 1983.
Alonso, B., and J. Livage, "Synthesis of Vanadium Oxide Gels From Peroxovanadic Acid Solutions: A $^{51}V$ NMR Study," Journal of Solid State Chemistry 148(1):16-19, Nov. 1999.

Amatucci, G.G., et al., "Cobalt Dissolution in $LiCoO_2$-Based Non-Aqueous Rechargeable Batteries," Solid State Ionics 83(1-2):167-173, Jan. 1996.
Amatucci, G.G., et al., "$CoO_2$, the End Member of the $Li_xCoO_2$ Solid Solution," Journal of the Electrochemical Society 143(3):1114-1123, Mar. 1996.
Andrukaitis, E., "Lithium Intercalation in Electrodeposited Vanadium Oxide Bronzes," Journal of Power Sources 119-121:205-210, Jun. 2003.
Antolini, E., "$LiCoO_2$: Formation, Structure, Lithium and Oxygen Nonstoichiometry, Electrochemical Behaviour and Transport Properties," Solid State Ionics 170(3-4):159-171, May 2004.
Arico, A.S., et al., "Nanostructured Materials for Advanced Energy Conversion and Storage Devices," Nature Materials 4(1):366-377, May 2005.
Ban, C., et al., "Electrospun Nano-Vanadium Pentoxide Cathode," Electrochemistry Communications 11(3):522-525, Mar. 2009.
Baudry, P., et al., "Electrochromic Window With Lithium Conductive Polymer Electrolyte," Journal of the Electrochemical Society 138(2):460-465, Feb. 1991.
Beke, S., "A Review of the Growth of $V_2O_5$ Films From 1885 to 2010," Thin Solid Films 519(6):1761-1771, Jan. 2011.
Beke, S., et al., "XRD and XPS Analysis of Laser Treated Vanadium Oxide Thin Films," Applied Surface Science 255(24):9779-9782, Sep. 2009.
Belov, D., and M.-H. Yang, "Investigation of the Kinetic Mechanism in Overcharge Process for Li-Ion Battery," Solid State Ionics 179(27-32):1816-1821, Sep. 2008.
Benayad, A., et al., "Vanadium Pentoxide Thin Films Used as Positive Electrode in Lithium Microbatteries: An XPS Study During Cycling," Journal of Physics and Chemistry of Solids 67(5-6):1320-1324, May-Jun. 2006.
Birks, L.S., and H. Friedman, "Particle Size Determination From X-Ray Line Broadening," Journal of Applied Physics 17(8):687-692, Aug. 1946.
Brinker, C.J., and G.W. Scherer, "Sol-Gel Science: The Physics and Chemistry of Sol-Gel Processing," Academic Press, San Diego, pp. 31-35,1990.
Bruce, P.G., "Energy Storage Beyond the Horizon: Rechargeable Lithium Batteries," Solid State Ionics 179(21-26):752-760, Sep. 2008.
Butler, A., et al., "Vanadium Peroxide Complexes," Chemical Reviews 94(3):625-638, May 1994.
Gao, G., "Growth of Oxide Nanorod Arrays Through Sol Electrophoretic Deposition," Journal of Physical Chemistry B 108(52)19921-19931, Nov. 2004.
Chen, C.H., et al., "Electrostatic Sol-Spray Deposition (ESSD) and Characterisation of Nanostructured $TiO_2$ Thin Films," Thin Solid Films 342(1-2):35-41, Mar. 1999.
Chen, J., et al., "Synthesis of Hierarchical Mesoporous Nest-Like $Li_4Ti_5O_{12}$ for High-Rate Lithium Ion Batteries," Journal of Power Sources 200:59-66, Feb. 2012.
Cheng, F., and J. Chen, "Transition Metal Vanadium Oxides and Vanadate Materials for Lithium Batteries," Journal of Materials Chemistry 21(27):9841-9848, Feb. 2011.
Chiarello, G., et al., "XPS and AFM Characterization of a Vanadium Oxide Film on $TiO_2$(100) Surface," Applied Surface Science 99(1):15-19, May 1996.
Cho, J., et al., "Novel $LiCoO_2$ Cathode Material With $Al_2O_3$ Coating for a Li Ion Cell," Chemistry of Materials 12(12):3788-3791, Nov. 2000.
Cho, J., et al., "Zero-Strain Intercalation Cathode for Rechargeable Li-Ion Cell," Angewandte Chemie International Edition 40(18):3367-3369, Sep. 2001.
Cocciantelli, J.M., et al., "Crystal Chemistry of Electrochemically Inserted $Li_{(x)}V_{(2)}O_{(5)}$," Journal of Power Sources 34(2):103-111, Mar. 1991.
Cogan, S.F., et al., "Optical Properties of Electrochromic Vanadium Pentoxide," Journal of Applied Physics 66(3):1333-1337, Aug. 1989.
Converse, A.O., "Renewable Energy in the United States: Is There Enough Land?" Applied Biochemistry and Biotechnology 137-140(1-12):611-624, Apr. 2007.

(56) References Cited

OTHER PUBLICATIONS

Croce, E, et al., "A Novel Concept for the Synthesis of an Improved LiFePO$_4$ Lithium Battery Cathode," Electrochemical and Solid-Slate Letters 5(3):A47-A50, Jan. 2002.

Croce, F., et al., "A Novel Concept for the Synthesis of an Improved LiFePO, Lithium Battery Cathode," Abstract in ChemInform 33(21):4, May 2002.

Cui, C.-J., et al., "A New High-Performance Cathode Material for Rechargeable Lithium-Ion Batteries: PolypyrroleNanadium Oxide Nanotubes," Electrochimica Acta Anaesthesiologica Scandinavica 55(28):8870-8875, Dec. 2010.

Dahn, J.R., et al., "Structure and Electrochemistry of Li(1±y)NiO$_2$ and a New Li$_2$NiO$_2$ Phase With the Ni(OH)$_2$ Structure," Solid State Ionics 44(1-2):87-97, Dec. 1990.

Delmas, C., et al., "w-Li(x)V$_2$O$_5$—A New Electrode Material for Rechargeable Lithium Batteries," Journal of Power Sources 34(2):113-118, Mar. 1991.

Deschamps, N., "Advanced Storage Battery Market: From Hybrid/Electric Vehicles to Cell Phones," SBI Energy White Paper, SBI, Rockville, Md., Oct. 2009, 11 pages.

Dickens, P.G., et al., "Phase Relationships in the Ambient Temperature Li(x)V$_2$O$_5$ System (0.1<x<1.0)," Materials Research Bulletin 14(10):1295-1299, Oct. 1979.

Doh, C.-H., et al., "Thermal and Electrochemical Behaviour of C/Li(x)CoO$_2$ Cell During Safety Test," Journal of Power Sources 175(2):881-885, Jan. 2008.

Fang, G.J., et al., "Synthesis and Structural, Electrochromic Characterization of Pulsed Laser Deposited Vanadium Oxide Thin Films," Journal of Vacuum Science and Technology A 19(3):887-892, May-Jun. 2001.

Feng, C.Q., et al., "Synthesis of Spherical Porous Vanadium Pentoxide and Its Electrochemical Properties," Journal of Power Sources 184(2):485-488, Oct. 2008.

Fergus, J.W., "Recent Developments in Cathode Materials for Lithium Ion Batteries," Journal of Power Sources 195(4):939-954, Feb. 2010.

Fontenot, C.J., et al., "Vanadia Gel Synthesis via Peroxovanadate Precursors. 2. Characterization of the Gels," Journal of Physical Chemistry B 105(43):10496-10504, Nov. 2001.

Frabetti, E., et al., "X-Ray Absorption Spectroscopy Study of Cu(0.25)V$_2$O$_5$ and Zn(0.25)V$_2$O$_5$ Aerogel-Like cathodes for Lithium Batteries," Journal of Physical Chemistry B 108(12):3765-3771, Mar. 2004.

Gerssen-Gondelach, S.J., and A.P.C. Faaij, "Performance of Batteries for Electric Vehicles on Short and Longer Term," Journal of Power Sources 212:111-129, Aug. 2012.

Gharbi, N., et al., "Mixed-Valence Polyvanadic Acid Gels," Inorganic Chemistry 21(7):2758-2765, Jul. 1982.

Giorgetti, M., et al., "Doped V$_2$O$_5$-Based Cathode Materials: Where Does the Doping Metal Go? An X-Ray Absorption Spectroscopy Study," Chemistry of Materials 19(24):5991-6000, Oct. 2007.

Gross, R., et al., "Progress in Renewable Energy," Environment International 29(1):105-122, Apr. 2003.

Haber, J., "Fifty Years of My Romance With Vanadium Oxide Catalysts," Catalysis Today 142(3-4):100-113, Apr. 2009.

Hoffmann, W., "PV Solar Electricity Industry: Market Growth and Perspective," Solar Energy Materials and Solar Cells 90(18-19):3285-3311, Nov. 2006.

Howarth, O.W., and J.R. Hunt, "Peroxo-Complexes of Vanadium(v); a Vanadium-51 Nuclear Magnetic Resonance Study," Journal of the Chemical Society, Dalton Transactions 9:1388-1391, Jan. 1979.

Hu, Y.-S., et al., "Electrochemical Lithiation Synthesis of Nanoporous Materials With Superior Catalytic and Capacitive Activity," Nature Materials 5(9):713-717, Sep. 2006.

Hub, S., et al., "X-Ray Investigations on Electroformed Li(x)V$_2$O$_5$ Bronzes," Electrochimica Acta 33(7):997-1002, Jul. 1988.

Im, J.S., et al., "Improved Capacitance Characteristics of Electrospun ACFs by Pore Size Control and Vanadium Catalyst," Journal of Colloid and Interface Science 327(1):115-119, Nov. 2008.

Swider-Lyons, K.E., et al., "Improved Lithium Capacity of Defective V$_2$O$_5$ Materials," Solid State Ionics 152-153:99-104, Dec. 2002.

Takahashi, K, et al., "Growth and Electrochemical Properties of Single-Crystalline V$_2$O$_5$ Nanorod Arrays," Japanese Journal of Applied Physics 44(18):662-668, Jan. 2005.

Takahashi, K., et al., "Growth and Electrochromic Properties of Single-Crystal V$_2$O$_5$ Nanorod Arrays," Applied Physics Letters 86(4):053102-1-053102-3, Jan. 2005.

Takahashi, K., et al., "Ni—V$_2$O$_5$•nH$_2$O Core—Shell Nanocable Arrays for Enhanced Electrochemical Intercalation," Journal of Physical Chemistry B 109(1):48-51, Jan. 2005.

Takahashi, K., et al., "Synthesis and Electrochemical Properties of Single-Crystal V$_2$O$_5$ Nanorod Arrays by Template-Based Electrodeposition," Journal of Physical Chemistry B 108(28):9795-9800, Jul. 2004.

Talledo, A., and C.G. Granqvist, "Electrochromic Vanadium-Pentoxide-Based Films: Structural, Electrochemical, and Optical Properties," Journal of Applied Physics 77(9):4655-4666, May 1995.

Talledo, A., et al., "Structure and Optical Absorption of Li(y)V$_2$O$_5$ Thin Films," Journal of Applied Physics 69(5):3261-3265, Mar. 1995.

Tang, Y., et al., "Vanadium Pentoxide Cathode Materials for High-Performance Lithium-Ion Batteries Enabled by a Hierarchical Nanoflower Structure via an Electrochemical Process," Journal of Materials Chemistry A 1(1):82-88, Jan. 2013.

Tarascon, J.-M., and M. Armand, "Issues and Challenges Facing Rechargeable Lithium Batteries," Nature 414(6861):359-367, Nov. 2001.

Tarascon, J.-M., et al., "Hunting for Better Li-Based Electrode Materials via Low Temperature Inorganic Synthesis," Chemistry of Materials 22(3):724-739, Feb. 2010.

Thackeray, M.M., "Structural Considerations of Layered and Spinel Lithiated Oxides for Lithium Ion Batteries," Journal of the Electrochemical Society 142(8):2558-2563, Aug. 1995.

Thackeray, M.M., et al., "Lithium Insertion Into Manganese Spinels," Materials Research Bulletin 18(4):461-472, Apr. 1983.

Van Der Biest, O.O., and L.J. Vandeperre, "Electrophoretic Deposition of Materials," Annual Review of Materials Science 29:327-352, Aug. 1999.

Varadaraajana, V., et al., "Direct Synthesis of Nanostructured V$_2$O$_5$ Films Using Solution Plasma Spray Approach for Lithium Battery Applications," Journal of Power Sources 196(24):10704-10711, Dec. 2011.

Vivier, V., et al., "Electrochemical Lithium Insertion in Sol-Gel Crystalline Vanadium Pentoxide Thin Films," Electrochimica Acta 44(5):831-839, Oct. 1998.

Wang, B., et al., "Synthesis of Nanosized Vanadium Pentoxide/Carbon Composites by Spray Pyrolysis for Electrochemical Capacitor Application," Electrochimica Acta 54(5):1420-1425, Feb. 2009.

Wang, C., et al., "Ultrathin SnO$_2$ Nanosheets: Oriented Attachment Mechanism, Nonstoichiometric Defects, and Enhanced Lithium-Ion Battery Performance," Journal of Physical Chemistry C 116(6):400-4011, Jan. 2012.

Wang, D., et al., "Self-Assembled TiO$_2$-Graphene Hybrid Nanostructures for Enhanced Li-Ion Insertion," ACS Nano 3(4):907-914, Apr. 2009.

Wang, W., and X. Wang, "Study of the Electrochemical Properties of a Transition Metallic Ions Modified Electrode in Acidic VOSO$_4$, Solution," Rare Metals 26(2):131-135, Apr. 2007.

Wang, Y., and G. Cao, "Developments in Nanostructured Cathode Materials for High-Performance Lithium-Ion Batteries," Advanced Materials 20(12):2251-2269, Jun. 2008.

Wang, Y., and G. Cao, "Li$^+$—Intercalation Electrochemical/Electrochromic Properties of Vanadium Pentoxide Films by Sol Electrophoretic Deposition," Electrochimica Acta 51:23:4865-4872, Jun. 2006.

(56) References Cited

OTHER PUBLICATIONS

Wang, Y., and G. Cao, "Synthesis and Enhanced Intercalation Properties of Nanostructured Vanadium Oxides," Chemistry of Materials 18(12):2787-2804, Jun. 2006.

Wang, Y., et al., "The Design of a LiFePO$_4$/Carbon Nanocomposite With a Core-Shell Structure and Its Synthesis by an In Situ Polymerization Restriction Method," Angewandte Chemie International Edition 47(39):7461-7465, Sep. 2008.

Wang, Y., et al., "Designed Strategy to Fabricate a Patterned V$_2$O$_5$ Nanobelt Array as a Superior Electrode for Li-Ion Batteries," Journal of Materials Chemistry 21(7):2362-2368, Feb. 2011.

Wang, Y., et al., "Effects of Thermal Annealing on the Li$^+$ Intercalation Properties of V$_2$O$_5$•nH$_2$O Xerogel Films," Journal of Physical Chemistry B 109(22):11361-11366, May 2005.

Wang, Z., et al., "Electrochromic Properties of Aqueous Sol-Gel Derived Vanadium Oxide Films With Different Thickness," Thin Solid Films 375(1-2):238-241, Oct. 2000.

Wei, Y., et al., "Improvement in Electrochemical Performance of V$_2$O$_5$ by Cu Doping," Journal of Power Sources 165(1):386-392, Feb. 2007.

West, K., et al., "V$_6$O$_{13}$ as Cathode Material for Lithium Cells," Journal of Power Sources 14(1-3):235-245, Jan.-Mar. 1985.

West, K., et al., "Vanadium Oxide Xerogels as Electrodes for Lithium Batteries," Electrochimica Acta 38(9):1215-1220, Jun. 1993.

Whittingham, M.S., "Electrical Energy Storage and Intercalation Chemistry," Science 192(4244):1126-1127, Jun. 1976.

Wilcox, J.D., et al., "Factors Influencing the Quality of Carbon Coatings on LiFePO$_4$," Journal of the Electrochemical Society 154(5):A389-A395, 2007.

Winter, M., et al., "Insertion Electrode Materials for Rechargeable Lithium Batteries," Advanced Materials 10(10):725-763, Jul. 1998.

Wu, C., and Y. Xie, "Promising Vanadium Oxide and Hydroxide Nanostructures: From Energy Storage to Energy Saving," Energy & Environmental Science 3(9):1191-1206, Aug. 2010.

Wu, Q., et al., "Homogenous LiCoO$_2$ Nanoparticles Prepared Using Surfactant P123 as Template and Its Application to Manufacturing Ultra-Thin-Film Electrode," Materials Chemistry and Physics 91(2-3):463-467, Jun. 2005.

Wu, Q.-H., "Electrochemical Potential of Intercalation Phase: Li/V$_2$O$_5$ System," Applied Surface Science 253(4):1713-1716, Dec. 2006.

Wu, Q.-H., et al., "Photoelectron Spectroscopy Study of Li Intercalation Into V$_2$O$_5$ Thin Films," Surface Science 578(1-3):203-212, Mar. 2005.

Wu, Q.-H., et al., "Photoelectron Spectroscopy Study of Oxygen Vacancy on Vanadium Oxides Surface," Applied Surface Science 236(1-4):473-478, Sep. 2004.

Yae, S., et al., "Solar to Chemical Conversion Using Metal Nanoparticle Modified Microcrystalline Silicon Thin Film Photoelectrode," Solar Energy Materials and Solar Cells 91(4):224-229, Feb. 2007.

Yin, H., et al., "Porous V$_2$O$_5$ Micro/Nano-Tubes: Synthesis via a CVD Route, Single-Tube-Based Humidity Sensor and Improved Li-Ion Storage Properties," Journal of Materials Chemistry 22(11):5013-5019, Feb. 2012.

Yoo, M., et al., "Interaction of Poly(vinylidene fluoride) With Graphite Particles. 2. Effect of Solvent Evaporation Kinetics and Chemical Properties of PVDF on the Surface Morphology of a Composite Film and Its Relation to Electrochemical Performance," Chemistry of Materials 16(10):1945-1953, May 2004.

Yoshino, T., et al., "Electrodeposition of Electrochromic V$_2$O$_5$ Thin Films," Journal of the Surface Science Society of Japan 6(3):198-205, 1985.

Yoshio, M., et al., "Preparation and Properties of LiCo(y)Mn(x)Ni(1-x-y)O(2) as a Cathode for Lithium Ion Batteries," Journal of Power Sources 90(2):176-181, Oct. 2000.

Yu, D., et al., "Effect of Manganese Doping on Li-Ion Intercalation Properties of V$_2$O$_5$ Films," Journal of Materials chemistry 20(48):10841-10846, Oct. 2010.

Yu, D., et al., "Mesoporous Vanadium Pentoxide Nanofibers With Significantly Enhanced Li-Ion Storage Properties by Electrospinning," Energy & Environmental Science 4(3):858-861, Mar. 2011.

Yu, H., et al., "Cu Doped V$_2$O$_5$ Flowers as Cathode Material for High-Performance Lithium Ion Batteries," Nanoscale 5(11):4937-4943, Apr. 2013.

Yu, L., et al., "Ultrasonic Synthesis and Electrochemical Characterization of V$_2$O$_5$/Mesoporous Carbon Composites," Microporous and Mesoporous Materials 126(1-2):58-64, Nov. 2009.

Zhan, S., et al., "Electrochemical Properties of Cr Doped V$_2$O$_5$ Between 3.8 V and 2.0 V," Solid State Ionics 180(20-22):1198-1203, Aug. 2009.

Zhan, S., et al., "Structural and Electrochemical Properties of Al$^{3+}$ Doped V$_2$O$_5$ Nanoparticles Prepared by an Oxalic Acid Assisted Soft-Chemical Method," Journal of Alloys and Compounds 502(1):92-96, Jul. 2010.

Zhang, H., et al., "Three-Dimensional Bicontinuous Ultrafast-Charge and -Discharge Bulk Battery Electrodes," Nature Nanotechnology 6(5)177-281, May 2011.

Zhang, Y.H., et al., "Carbon Monoxide Annealed TiO$_2$ Nanotube Array Electrodes for Efficient Biosensor Applications," Journal of Materials Chemistry 19(7):948-953, Feb. 2009.

International Search Report dated Jan. 29, 2014, issued in International Application No. PCT/US2013/068561, filed Nov. 5, 2013, 2 pages.

Shlyakhtin, O.A., and Y.-J. OH, "Inorganic Cryogels for Energy Saving and Conversion," Journal of Electroceramics 23(2-4):452-461, Oct. 2009.

Armand, M., and J.-M. Tarascon, "Building Better Batteries," Nature 451(7179):652-657, Feb. 2008.

Aurbach, D., et al., "Common Electroanalytical Behavior of Li Intercalation Processes Into Graphite and Transition Metal Oxides," Journal of the Electrochemical Society 145(9):3024-3034, 1998.

Baddour-Hadjean, R., et al., "Raman Microspectrometry Study of Electrochemical Lithium Intercalation Into Sputtered Crystalline V$_2$O$_5$ Thin Films," Chemistry of Materials 20(5):1916-1923, Feb. 2008.

Baddour-Hadjean, R., et al., "Structural Modifications of Li$_x$V$_2$O$_5$ in a Composite Cathode ($0 \le x < 2$) Investigated by Raman Microspectrometry," Journal of Raman Spectroscopy 43(1):153-160, Jan. 2012.

Bruce, P.G., et al., "Nanomaterials for Rechargeable Lithium Batteries," Angewandte Chemie International Edition 47(16):2930-2946, Apr. 2008.

Cao, A.M., et al., "Self-Assembled Vanadium Pentoxide (V$_2$O$_5$) Hollow Microspheres From Nanorods and Their Application in Lithium-Ion Batteries," Angewandte Chemie International Edition 44(28):4391-4395, Jul. 2005.

Chan, C.K., et al., "Fast, Completely Reversible Li Insertion in Vanadium Pentoxide Nanoribbons," Nano Letters 7(2):490-495, Feb. 2007.

Chernova, N.A., et al., "Layered Vanadium and Molybdenum Oxides: Batteries and Electrochromics," Journal of Materials Chemistry 19(17):2526-2552, Mar. 2009.

Choi, N.-S., et al., "Challenges Facing Lithium Batteries and Electrical Double-Layer Capacitors," Angewandte Chemie International Edition 51(40):9994-10024, Oct. 2012.

Delmas, C., et al., "The Li$_x$V$_2$O$_5$ System: An Overview of the Structure Modifications Induced by the Lithium Intercalation," Solid State Ionics 69(3-4):257-264, Aug. 1994.

Etacheri, V., et al., "Challenges in the Development of Advanced Li-Ion Batteries: A Review," Energy & Environmental Science 4(9):3243-3262, Jul. 2011.

Fontenot, C.J., et al., "Vanadia Gel Synthesis via Peroxovanadate Precursors. 1. In Situ Laser Raman and $^{51}$V NMR Characterization of the Gelation Process," Journal of Physical Chemistry B 104(49):11622-11631, Nov. 2000.

Hu, Y.-S., et al., "Synthesis and Electrode Performance of Nanostructured V$_2$O$_5$ by Using a Carbon Tube-in-Tube as a Nanoreactor and an Efficient Mixed-Conducting Network," Angewandte Chemie International Edition 18(1):210-214, Dec. 2008.

(56) References Cited

OTHER PUBLICATIONS

Kim, T.-H., et al., "The Current Move of Lithium Ion Batteries Towards the Next Phase," Advanced Energy Materials 2(7):860-872, Jul. 2012.
Levi, M.D. and D. Aurbach, "Impedance of a Single Intercalation Particle and of Non-Homogeneous, Multilayered Porous Composite Electrodes for Li-ion Batteries," Journal of Physical Chemistry B 108(31):11693-11703, Jul. 2004.
Li, H., et al. "Research on Advanced Materials for Li-ion Batteries," Advanced Materials 21(45):4593-4607, Dec. 2009.
Li, Y., et al., "Leaf-Like $V_2O_5$ Nanosheets Fabricated by a Facile Green Approach as High Energy Cathode Material for Lithium-Ion Batteries," Advanced Energy Materials 3(9):1171-1175, Sep. 2013.
Liu, J. and X.-W. Liu, "Two-Dimensional Nanoarchitectures for Lithium Storage," Advanced Materials 24(30):4097-4111, Aug. 2012.
Liu, J., et al., "Double-Shelled Nanocapsules of $V_2O_5$-Based Composites as High-Performance Anode and Cathode Materials for Li Ion Batteries," Journal of the American Chemical Society 131(34):12086-12087, Sep. 2009.
Liu, J. et al., "Sandwich-Like, Stacked Ultrathin Titanate Nanosheets for Ultrafast Lithium Storage," Advanced Materials 23(8):998-1002, Feb. 2011.
Liu, J., et al., "Template-Free Solvothermal Synthesis of Yolk-Shell $V_2O_5$ Microspheres as Cathode Materials for Li-Ion Batteries," Chemical Communications 47(37):10380-10382, Oct. 2011.
Liu, Y.Y., et al., "V2O5 Nano-Electrodes With High Power and Energy Densities for Thin Film Li-Ion Batteries," Advanced Energy Materials 1(2):194-202, Mar. 2011.
Livage, J., "Vanadium Pentoxide Gels," Chemistry of Materials 3(4):578-593, Jul. 1991.
Mai, L., et al., "Electrospun Ultralong Hierarchical Vanadium Oxide Nanowires With High Performance for Lithium Ion Batteries," Nano Letters 10(11):4750-4755, Nov. 2010.
Muster, J., et al., "Electrical Transport Through Individual Vanadium Pentoxide Nanowires," Advanced Materials 12(6):420-424, Mar. 2000.
Nobili, F., et al., "Electronic and Electrochemical Properties of L(i)xNi(1-y)Co(y)O(2) Cathodes Studied by Impedance Spectroscopy," Chemistry of Materials 13(5):1642-1646, Apr. 2001.
Odani, A., et al., "Testing Carbon-Coated VO(x) Prepared via Reaction Under Autogenic Pressure at Elevated Temperature as Li-Insertion Materials," Advanced Materials 18(11):1431-1436, Jun. 2006.
Pan, A., et al., "Facile Synthesized Nanorod Structured Vanadium Pentoxide for High-Rate Lithium Batteries," Journal of Materials Chemistry 20(41):9193-9199, Sep. 2010.
Petkov, V., et al., "Structure of V(2)O(5)·nH(2)O Xerogel Solved by the Atomic Pair Distribution Function Technique," Journal of the American Chemical Society 124(34):10157-10162, Aug. 2002.
Qu, Q., et al., "Core—Shell Structure of Polypyrrole Grown on $V_2O_5$ Nanoribbon as High Performance Anode Material for Supercapacitors," Advanced Energy Materials 2(8):950-955, Aug. 2012.
Reddy, M.V., et al., "Metal Oxyfluorides $TiOF_2$ and $NbO_2F$ as Anodes for Li-Ion Batteries," Journal of Power Sources 162(2):1312-1321, Nov. 2006.
Reddy, M.V., et al., "Preparation and Characterization of LiNi(0.5)Co(0.5)O(2) and LiNi(0.5)Co(0.4)Al(0.1)O(2) by Molten Salt Synthesis for Li Ion Batteries," Journal of Physical Chemistry C 111(31):11712-11720, Jul. 2007.
Sakunthala, A., et al., "Energy Storage Studies of Bare and Doped Vanadium Pentoxide, (V1.95M(0.05))O(5), M= Nb, Ta, for Lithium Ion Batteries," Energy & Environmental Science 4(5):1712-1725, Mar. 2011.
Wang, J.X., et al., "Influences of Treatment Temperature and Water Content on Capacity and Rechargeability of Xerogel Films," Journal of the Electrochemical Society 151(1):A1-A7,2004.

Wang, S., et al., "Porous Monodisperse $V_2O_5$ Microspheres as Cathode Materials for Lithium-Ion Batteries," Journal of Materials Chemistry 21(17):6365-6369, Mar. 2011.
Wang, S., et al., "Three-Dimensional Porous $V_2O_5$ Cathode With Ultra High Rate Capability," Energy & Environmental Science 4(8):2854-2857, Jun. 2011.
Wang, Y., et al., "Nanostructured Vanadium Oxide Electrodes for Enhanced Lithium-Ion Intercalation," Advanced Functional Materials 16(9):1133-1144, Jun. 2006.
Wang, Y., et al., "One Pot Synthesis of Self-Assembled $V_2O_5$ Nanobelt Membrane via Capsule-Like Hydrated Precursor as Improved Cathode for Li-Ion Battery," Journal of Materials Chemistry 21(28):10336-10341, Jun. 2011.
Wang, Z.-L., et al., "Facile and Low-Cost Synthesis of Large-Area Pure $V_2O_5$ Nanosheets for High-Capacity and High-Rate Lithium Storage Over a Wide Temperature Range," ChemPlusChem 77(2):124-128, Feb. 2012.
Whittingham, M.S., "Lithium Batteries and Cathode Materials," Chemical Reviews 104(10):4271-4301, Oct. 2004.
Whittingham, M.S., "Materials Challenges Facing Electrical Energy Storage," MRS Bulletin 33(4):411-419, Apr. 2008.
Yan, J., et al., "$V_2O_5$ Loaded on $SnO_2$ Nanowires for High-Rate Li Ion Batteries," Advanced Materials 23(6):746-750, Feb. 2011.
Zhai, T., et al., "Centimeter-Long $V_2O_5$ Nanowires: From Synthesis to Field-Emission, Electrochemical, Electrical Transport, and Photoconductive Properties," Advanced Materials 22(23):2547-2552, Jun. 2010.
Mao, L.-J., et al., "Template-Free Synthesis of VO(x) Hierarchical Hollow Spheres," Journal of Materials Chemistry 18(14)1640-1643, Mar. 2008.
Mao, S.S., and X. Chen, "Selected Nanotechnologies for Renewable Energy Applications," International Journal of Energy Research 31(6-7):619-636, May 2007.
Martha, S.K., et al., "A Comparative Study of Electrodes Comprising Nanometric and Submicron Particles of LiNi (0.50)Mn(0.50)O(2), LiNi(0.33)Mn(0.33)Co(0.33)O(2), and LiNi(0.40)Mn(0.40)Co(0.20)O(2) Layered Compounds," Journal of PowerSources 189(1):248-255, Apr. 2009.
Martha, S.K., et al., "A Short Review on Surface Chemical Aspects of Li Batteries: A Key for a Good Performance," Journal of Power Sources 189(1):288-296, Apr. 2009.
Meethong, N., et al., "Aliovalent Substitutions in Olivine Lithium Iron Phosphate and Impact on Structure and Properties." Advanced Functional Materials 19(7):1060-1070, Apr. 2009.
Mizushima, K., et al., "Li(x)CoO(2) (0 < xO ≤1): A New Cathode Material for Batteries of High Energy Density," Solid State Ionics 3-4:171-174, Aug. 1981.
Mohan, V.M., et al., "Synthesis, Structural, and Electrochemical Performance of $V_2O_5$ Nanotubes as Cathode Material for Lithium Battery," Journal of Applied Electrochemistry 39(10):2001-2006, Oct. 2009.
Moskalyk, R.R., and A.M. Alfantazi, "Processing of Vanadium: A Review," Minerals Engineering 16(9):793-805, Sep. 2003.
Moss, P.L., et al., "Investigation of Cycle Life of Li—Li(x)V2O5 Rechargeable Batteries," Journal of Power Sources 124(1):261-265, Oct. 2003.
Nagase, K., et al., "Electrochromic Properties of Vanadium Pentoxide Thin Films Prepared by New Wet Process," Applied Physics Letters 60(7):802-804, Feb. 1992.
Navone, C., et al., "Electrochemical and Structural Properties of $V_2O_5$ Thin Films Prepared by DC Sputtering," Proceedings of the International Workshop on Advanced Techniques for Energy Sources Investigation and Testing, Sep. 4-9, 2004, Sofia, Bulgaria, pp. L5-1-L5-7.
Notification of the First Office Action, dated Feb. 4, 2015, issued in Chinese Application No. 201180060088.0, filed Oct. 17, 2011, 15 pages.
Notification of the Second Office Action, dated Aug. 10, 2015, issued in Chinese Application No. 201180060088.0, filed Oct. 17, 2011, 13 pages.
Notification of the Third Office Action, dated Mar. 15, 2016, issued in Chinese Application No. 201180060088.0, filed Oct. 17, 2011, 12 pages.

(56) References Cited

OTHER PUBLICATIONS

Oh, S.-M., et al., "High-Performance Carbon-LiMnPO$_4$ Nanocomposite Cathode for Lithium Batteries," Advanced Functional Materials 20(19):3260-3265, Oct. 2010.

Oh, S.-W., et al., "Double Carbon Coating of LiMnPO$_4$ as High Rate Electrode for Rechargeable Lithium Batteries," Advanced Materials 22(43):4842-4845, Nov. 2010.

Ohzuku, T., and A. Ueda, "Why Transition-Metal (Di)oxides Are the Most Attractive Materials for Batteries," Solid State Ionics 69(3-4):201-211, Aug. 1994.

Ohzuku, T., et al., "Comparative Study of LiCoO$_2$, LiNi(1/2)Co(1/2)O$_2$ and LiNiO$_2$ for 4-Volt Secondary Lithium Cells," ElectroActa 38(9):1159-1167, Jun. 1993.

Ohzuku, T., et al., "Electrochemistry and Structural Chemistry of LiNiO$_2$ (R3m) for 4 Volt Secondary Lithium Cells," Journal of the Electrochemical Society 140(7):1862-1870, Jul. 1993.

Ozawa, K., "Lithium-Ion Rechargeable Batteries With LiCoO$_2$ and Carbon Electrodes: the LiCoO$_2$/C System," Solid State Ionics 69(3-4):212-221, Aug. 1994.

Ozer, N., "Electrochemical Properties of Sol-Gel Deposited Vanadium Pentoxide Films," Thin Solid Films 305(1-2):80-87, Aug. 1997.

Padhi, A.K., et al., "Phospho-Olivines as Positive-Electrode Materials for Rechargeable Lithium Batteries," Journal of the Electrochemical Society 144(4):1188-1194, Apr. 1997.

Park, H.-K., and W.H. Smyrl, "V$_2$O$_5$ Xerogel Films as Intercalation Hosts for Lithium," Journal of the Electrochemical Society 141(3):L25-L26, Mar. 1994.

Park, H.-K., et al., "V$_2$O$_5$ Xerogel Films as Intercalation Hosts for Lithium. I. Insertion Stoichiometry. Site Concentration. and Specific Energy," Journal of the Electrochemical Society 142(4):1068-1073, Apr. 1995.

Passerini, S., et al., "Spin-Coated V$_2$O$_5$ Xerogel Thin Films. 1. Microstructure and Morphology," Chemistry of Materials 7(4):780-785, Apr. 1995.

Pomerantseva, E., et al., "Electrochemical Performance of the Nanostructured Biotemplated V$_2$O$_5$ Cathode for Lithium-Ion Batteries," Journal of Power Sources 206:282-287, May 2012.

Potiron, E., et al., "Electrochemically Synthesized Vanadium Oxides as Lithium Insertion Hosts," Electrochimica Acta 45(1-2):197-214, Sep. 1999.

Potiron, E., et al., "e-V$_2$O$_5$: Relationships Between Synthesis Conditions, Material Characteristics and Lithium Intercalation Behavior," Journal of Power Sources 81-82:666-669, Sep. 1999.

Prosini, P.P., et al., "Performance and Capacity Fade of V$_2$O$_5$-Lithium Polymer Batteries at a Moderate-Low Temperature," Electrochimica Acta 46(17):2623-2629, May 2001.

Reddy, R.N., and R.G. Reddy, "Porous Structured Vanadium Oxide Electrode Material for Electrochemical Capacitors," Journal of Power Sources 156(2):700-704, Jun. 2006.

Reimers, J.N., and J.R. Dahn, "Electrochemical and In Situ X-Ray Diffraction Studies of Lithium Intercalation in Li(x)CoO(2)," Journal of the Electrochemical Society 139(8):2091-2097, Aug. 1992.

Ren, X., et al., "Preparation and Electrochemical Properties of V$_2$O$_5$ Submicron-Belts Synthesized by a Sol-Gel H$_2$O$_2$ Route," Journal of Sol-Gel Science and Technology 51(2):133-138, Aug. 2009.

Rougier, A., et al., "Optimization of the Composition of the Li(1-z)Ni(1+z)O(2) Electrode Materials: Structural, Magnetic, and Electrochemical Studies," Journal of the Electrochemical Society 143(4):1168-1175, Apr. 1996.

Sakunthala, A., et al., "Preparation, Characterization, and Electrochemical Performance of Lithium Trivanadate Rods by a Surfactant-Assisted Polymer Precursor Method for Lithium Batteries," Journal of Physical Chemistry C 114(17):8099-8107, Apr. 2010.

Salvi, A.M., et al., "Lithium Intercalation on Amorphous V$_2$O$_5$ Thin Film, Obtained by R.F. Deposition, Using In Situ Sample Transfer for XPS Analysis," Surface and Interface Analysis 35(11):897-905, Nov. 2003.

Sarkar, P., and P.S. Nicholson, "Electrophoretic Deposition (EPD): Mechanisms, Kinetics, and Application to Ceramics," Journal of the American Ceramic Society 79(8):1987-2002, Aug. 1996.

Sasidharan, M., et al., "V$_2$O$_5$ Hollow Nanospheres: A Lithium Intercalation Host With Good Rate Capability and Capacity Retention," Journal of the Electrochemical Society 159(5):A618-A621, Mar. 2012.

Scrosati, B., et al., "Lithium-Ion Batteries. A Look Into the Future," Energy & Environmental Science 4(9):3287-3295, Jul. 2011.

Search Report, dated Jan. 26, 2015, issued in Chinese Application No. 201180060088.0, filed Oct. 17, 2011 2011, 7 pages.

Semenenko, D.A., et al., "Growth ofThin Vanadia Nanobelts With Improved Lithium Storage Capacity in Hydrothermally Aged Vanadia Gels," CrystEngComm 14(5):1561-1567, Mar. 2012.

Shaju, K.M., and P.G. Bruce, "Macroporous Li(Ni(1/3)Co(1/3)Mn(1/3))O$_2$: A High Power and High-Energy Cathode for Rechargeable Lithium Batteries," Advanced Materials 18(17):2330-2334, Sep. 2006.

Shannon, R.D., "Revised Effective Ionic Radii and Systematic Studies of Interatomic Distances in Halides and Chalcogenides," Acta Crystallographica Section A 32(5):751-767, Sep. 1976.

Shum, K.L., and C. Watanabe, "Photovoltaic Deployment Strategy in Japan and the USA—An Institutional Appraisal," Energy Policy 35(2):1186-1195, Feb. 2007.

Sides, C.R., et al., "A High-Rate, Nanocomposite LiFePO$_4$/Carbon Cathode," Electrochemical and Solid-State Letters 8(9):A484-A487, 2005.

Sides, C.R., et al., "Nanoscale Materials for Lithium-Ion Batteries," MRS Bulletin 27(8):604-607, Aug. 2002.

Slebodnick, C., and V.L. Pecoraro, "Solvent Effects on $^{51}$V NMR Chemical Shifts: Characterization of Vanadate and Peroxovanadate Complexes in Mixed Water/Acetonitrile Solvent," Inorganica Chimica Acta 283(1):37-43, Dec. 1998.

Soudan, P., "Sol-Gel Chromium-Vanadium Mixed Oxides as Lithium Insertion Compounds," Solid State Ionics 135(1-4):291-295, Nov. 2000.

Światowska-Mrowiecka, J., et al., "Ageing of V$_2$O$_5$ Thin Films Induced by Li Intercalation Multi-Cycling," Journal of Power Sources 170(1):160-172, Jun. 2007.

Światowska-Mrowiecka, J., et al., "XPS Study of Li Ion Intercalation in V$_2$O$_5$ Thin Films Prepared by Thermal Oxidation of Vanadium Metal," Electrochimica Acta 52(18):5644-5653, May 2007.

International Preliminary Report on Patentability dated Apr. 16, 2013, issued in corresponding International Application No. PCT/US2011/056583, filed Oct. 17, 2011, 7 pages.

International Search Report and Written Opinion dated May 21, 2012, issued in corresponding International Application No. PCT/US2011/056583, filed Oct. 17, 2011, 10 pages.

International Search Report and Written Opinion, dated Jan. 29, 2014, issued in International Application No. PCT/US2013/068561, filed Nov. 5, 2013, 10 pages.

Jiang, C., et al., "Effect of Particle Dispersion on High Rate Performance of Nano-Sized Li$_4$Ti$_5$O$_{12}$ Anode," Electrochimica Acta 52(23):6470-6475, Jul. 2007.

Jiang, R., et al., "A Novel Method to Prepare Nanostructured Manganese Dioxide and Its Electrochemical Properties as a Supercapacitor Electrode," Electrochimica Acta 54(11):3047-3052, Apr. 2009.

Jozwiak, P., et al., "The Thermal Stability, Local Structure and Electrical Properties of Lithium-Iron Phosphate Glasses," Materials Science 27(2):307-318, Jun. 2009.

Jugović, D., and D. Uskoković, "A Review of Recent Developments in the Synthesis Procedures of Lithium Iron Phosphate Powders," Journal of Power Sources 190(2):538-544, May 2009.

Kalyani, P., and N. Kalaiselvi, "Various Aspects of LiNiO$_2$ Chemistry: A Review," Science and Technology of Advanced Materials 6(6):689-703, Sep. 2005.

Kang, K., et al., "Electrodes With High Power and High Capacity for Rechargeable Lithium Batteries," Science 311(5763):977-980, Feb. 2006.

Kim, H.-K., et al., "Fabrication of a Thin Film Battery Using a Rapid-Thermal-Annealed LiNiO$_2$ Cathode," Electrochemical and Solid-State Letters 5(11):A252-A255, Nov. 2002.

(56) References Cited

OTHER PUBLICATIONS

Kim, J.-K., et al., "Enhancement of Electrochemical Performance of Lithium Iron Phosphate by Controlled Sol-Gel Synthesis," Electrochimica Acta 53(38):8258-8264, Nov. 2008.

Kim, Y.-T., et al., "Performance of Electrostatic Spray-Deposited Vanadium Pentoxide in Lithium Secondary Cells," Journal of Power Sources 117(1-2):110-117, May 2003.

Kobayashi, H., et al., "Investigation on Lithium De-Intercalation Mechanism for Li(1-y)Ni(1/3)Mn(1/3)Co(1/3)O(2)," Journal of Power Sources 146(1-2):640-644, Aug. 2005.

Kumta, P.N., et al., "Synthesis of $LiCoO_2$ Powders for Lithium-Ion Batteries From Precursors Derived by Rotary Evaporation," Journal of Power Sources 72(1):91-98, Mar. 1998.

Kuwata, N., et al., "Thin-Film Lithium-Ion Battery With Amorphous Solid Electrolyte Fabricated by Pulsed Laser Deposition," Electrochemistry Communications 6(4):417-421, Apr. 2004.

Le Van, K., et al., "Amorphous Vanadium Oxide Films Synthesised by ALCVD for Lithium Rechargeable Batteries," Journal of Power Sources 160(1):592-601, Sep. 2006.

Lee, J.-K., et al., "Electrodeposition of Mesoporous $V_2O_5$ With Enhanced Lithium-Ion Intercalation Property," Electrochemistry Communications 11(8):1571-1574, Aug. 2009.

Lee, K.T., and J. Cho, "Roles of Nanosize in Lithium Reactive Nanomaterials for Lithium Ion Batteries," Nano Today 6(1):28-41, Feb. 2011.

Lee, S.W., et al., "High-Power Lithium Batteries From Functionalized Carbon-Nanotube Electrodes," Nature Nanotechnology 5(7):531-537, Jul. 2010.

Legendre, J.-J., et al., "Vanadium Pentoxide Gels: II. Structural Study by X-Ray Diffraction," Journal of Colloid and Interface Science 94(1):84-89, Jul. 1983.

Leger, C., et al., "Structural and Electrochemical Properties of w-$LixV_2O_5$ (0.4≤ x ≤3) as Rechargeable Cathodic Matenal for Lithium Batteries," Journal of the Electrochemical Society 152(1):A236-A241, 2005.

Li, G., et al., "Environmentally Friendly Chemical Route to Vanadium Oxide Single-Crystalline Nanobelts as a Cathode Material for Lithium-Ion Batteries," Journal of Physical Chemistry B 110(19):9383-9386, Apr. 2006.

Li, S.-R., et al., "Three-Dimensional Porous Fe(0.1)V(2)O(5.15) Thin Film as a Cathode Material for Lithium Ion Batteries," Electrochimica Acta 64(1):81-86, Mar. 2012.

Li, X. et al., "Hierarchically Porous Bioactive Glass Scaffolds Synthesized With a PUF and P123 Cotemplated Approach," Chemistry of Materials 19(17):4322-4326, Aug. 2007.

Li, Y., et al., "Effect of Interlayer Anions on the Electrochemical Performance of Al-Substituted α-Type Nickel Hydroxide Electrodes," International Journal of Hydrogen Energy 35(6):2539-2545, Mar. 2010.

Li, Y., et al., "Sn-Doped $V_2O_5$ Film With Enhanced Lithium-Ion Storage Performance," Journal of Physical Chemistry C 117(45):23507-23514, Oct. 2013.

Li, Y., et al., "Synthesis and Electrochemical Performance of Mixed Phase α/β Nickel Hydroxide," Journal of Power Sources 203:177-183, Apr. 2012.

Limmer, S.J., et al., "Electrophoretic Growth of Lead Zirconate Titanate Nanorods," Advanced Materials 13(16):1269-1272, Aug. 2001.

Limmer S.J., et al. "Template-Based Growth of Various Oxide Nanorods by Sol-Gel Electrophoresis," Advanced Funtional Materials 12(1):59-64, Jan. 2002.

Lindström, H., et al., "$Li^+$ Ion Insertion in $TiO_2$ (Anatase). 2. Voltammetry on Nanoporous Films," Journal of Physical Chemistry B 101(39):7717-7722, Sep. 1997.

"Lithium Ion Batteries," Wikipedia, The Free Encyclopedia, May 20,2015 <http://en.wikipedia.org/wiki/Lithium-ion_battery> [retrieved May 22, 2015], 25 pages.

Liu, C., et al., "Advanced Materials for Energy Storage," Advanced Materials 22(8):E28-E62, Feb. 2010.

Liu, D., and G. Cao, "Engineering Nanostructured Electrodes and Fabrication of Film Electrodes for Efficient Lithium Ion Intercalation," Energy & Environmental Science 3(9):1218-1237, Aug. 2010.

Liu, D., et al., "Atomic Layer Deposition of $Al_2O_3$ on $V_2O_5$ Xerogel Film for Enhanced Lithium Ion Intercalation," Journal of Vacuum Science and Technology A 30(1):01A123-1-01A123-6, Jan.-Feb. 2012.

Liu, D., et al., "Enhanced Lithium-Ion Intercalation Properties of $V_2O_5$ Xerogel Electrodes With Surface Defects," Journal of Physical Chemistry C 115(11):4959-4965, Mar. 2011.

Liu, D., et al., "High Energy Density Lithium Ion Batteries Using $Li(2.6)Co(0.4-x)Cu(x)N$ (Anode) and $Cu(0.04)V_2O_5$(Cathode) Electrode Materials," Materials Letters 62(26):4210-4212, Oct. 2008.

Liu, D., et al., "Hydrous Manganese Dioxide Nanowall Arrays Growth and Their Li Ions Intercalation Electrochemical Properties," Chemistry of Materials 20(4)1376-1380, Feb. 2008.

Liu, D., et al., "Mesoporous Hydrous Manganese Dioxide Nanowall Arrays With Large Lithium Ion Energy Storage Capacities," Advanced Functional Materials 19(7):1015-1023, Apr. 2009.

Liu, D., et al., "$V_2O_5$ Xerogel Electrodes With Much Enhanced Lithium-Ion Intercalation Properties With $N_2$ Annealing," Journal of Materials Chemistry 19(46):8789-8795, Nov. 2009.

Liu, H., et al., "Kinetics of Conventional Carbon Coated-$Li_3V_2(PO_4)_3$ and Nanocomposite $Li_3V_2(PO_4)_3$/Graphene as Cathode Materials for Lithium Ion Batteries," Journal of Materials Chemistry 22(22):11039-11047, Mar. 2012.

Liu, P., et al., "Preparation and Lithium Insertion Properties of Mesoporous Vanadium Oxide," Advanced Materials 14(1):27-30, Jan. 2002.

Liu, S.-Q., et al., "Synthesis of Lithium-Ion Battery Cathode Material $Li_3V_2(PO_4)_3$ by Sol-Gel Procedure," Chinese Journal of Inorganic Chemistry 22(4):645-650, Apr. 2006.

Liu, Y., et al., "Engineering Nanostructured Electrodes Away From Equilibrium for Lithium-Ion Batteries," Journal of Materials Chemistry 21(27):9969-9983, Jul. 2011.

Liu, Y., et al., "Lithium Iron Phosphate/Carbon Nanocomposite Film Cathodes for High Energy Lithium Ion Batteries," Electrochimica Acta 56(5):2559-2565, Feb. 2011.

Liu, Y., et al., "Porous Nanostructured $V_2O_5$ Film Electrode With Excellent Li-Ion Intercalation Properties," Electrochemistry Communications 13(11):1276-1279, Nov. 2011.

Liu, Z., et al., "Synthesis and Characterization of LiNi(1-x-y)Co(x)Mn(y)O(2) as the Cathode Materials of Secondary Lithium Batteries," Journal of Power Sources 81-82:416-419, Sep. 1999.

Livage, J., et al., "Vanadium Pentoxide Sol and Gel Mesophases," Journal of Sol-Gel Science and Technology 19(1-3):275-278, Dec. 2000.

Lund, P.O., "Upfront Resource Requirements for Large-Scale Exploitation Schemes of New Renewable Technologies," Renewable Energy 32(3):442-458, Mar. 2007.

Maier, J., "Nanoionics: Ion Transport and Electrochemical Storage in Confined Systems," Nature Materials 4(11):805-815, Nov. 2005.

Mantoux, A., et al., "Vanadium Oxide Films Synthesized by CVD and Used as Positive Electrodes in Secondary Lithium Batteries," Journal of the Electrochemical Society 151(3):A368-A373, Jan. 2004.

Moretti, Arianna, et al. "$V_2O_5$ Aerogel as a Versatile Cathode Material for Lithium and Sodium Batteries." ChemElectroChem, 2, 2015, pp. 529-537. Wiley Online Library doi:10.1002/celc.201402394. 9 pages.

Baes, C. F., et al. "In the Hydrolysis of Cations." Wiley. New York. 1976; p. 209, section 10.2.8. 8 pages.

* cited by examiner

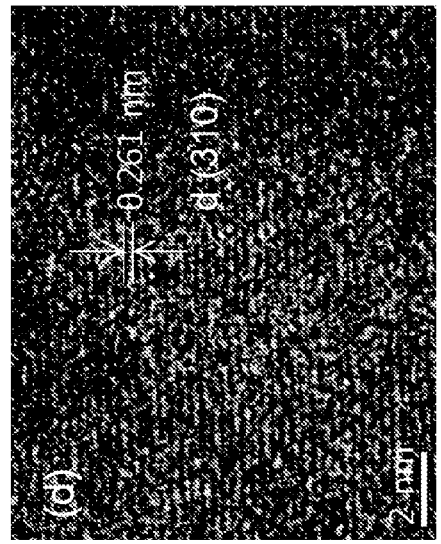
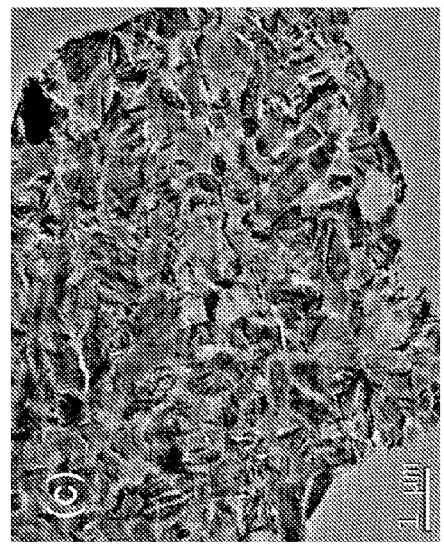
FIG. 2A  FIG. 2B  FIG. 2C  FIG. 2D

… …

POLYCRYSTALLINE VANADIUM OXIDE NANOSHEETS

CROSS-REFERENCE TO RELATED APPLICATION

This application claims the benefit of U.S. Provisional Application No. 61/722,709, filed Nov. 5, 2012, which is expressly incorporated herein by reference in its entirety.

STATEMENT OF GOVERNMENT LICENSE RIGHTS

This invention was made with U.S. government support under CMMI-10300048, awarded by the National Science Foundation. The U.S. Government has certain rights in the invention.

BACKGROUND

Energy storage technology is incontrovertibly one of the great challenges in the modern society facing environmental and ecological concerns, and the lithium ion battery is regarded as one of the most important energy storage devices due to its extensive applications in many areas including portable electronic devices, electric vehicles and implantable medical devices. As the heart of clean energy devices, the development of energy storage materials holds the key to the new generation of energy storage devices in the 21$^{st}$ century. Nanostructured materials have attracted increasing interests in the field of energy materials due to superior electrochemical properties benefited from the unique nanostructure, such as nanoscale dimension, high surface area and large structural freedom which could provide high energy and power density while holding the mechanical integrity and chemical stability after many intercalation/deintercalation cycles.

Vanadium oxide is a multi-functional material which has extensive applications in various fields. Since its first investigation as a battery material for lithium ion batteries over 40 years ago, it has been discovered that during Li$^+$ ions intercalation vanadium pentoxide ($V_2O_5$) possesses high specific electrochemical capacity (theoretical capacity 450 mA h g$^{-1}$) with four phase transitions which involves five successive phases of $Li_xV_2O_5$ (0<x<3): α (x<0.01), ε (0.35<x<0.7), δ (0.9<x≤1), γ (0<x≤2) and the irreversible ω (x>2). Although the Li-ion intercalation voltage is lower than $LiCoO_2$ or $LiMn_2O_4$, $V_2O_5$ has still been regarded as one of the most popular cathode candidates for Li ion batteries due to these advantages: $V_2O_5$ provides higher energy and power density than $LiCoO_2$ and $LiFePO_4$, is easier and more controllable fabrication method than $LiMO_2$ (M=Ni, Mn, Co, Fe), and has higher capacity and better cyclic stability than $LiMn_2O_4$. There are various processing methods to prepare nanostructured vanadium pentoxide with high electrochemical performance for lithium ion batteries: self-assembled $V_2O_5$ hollow microspheres from nanorods; $V_2O_5$ submicro-belts from sol-gel precursor combined with hydrothermal method; Electrospun $V_2O_5$ nanofibers; Electrostatic spray-deposited $V_2O_5$; co-precipitated macro-plates $V_2O_5$ from water/ethanol media and $V_2O_5$ nanowires from chemical vapor transport. These nanostructured vanadium pentoxide materials have shown improved electrochemical performance in comparison with conventional cathode materials for lithium ion batteries, however due to the high cost of fabrication and complicated processing method, the broad industrial applications of such nanomaterials are limited.

Therefore, what is desired is an improved method for forming $V_2O_5$ that provides $V_2O_5$ films with superior properties when incorporated as cathodes in lithium-ion batteries.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a $V_2O_5$ nanosheet is provided having a thickness of from about 3 nm to 1000 nm and a specific surface area of from about 1 m$^2$ g$^{-1}$ to about 500 m$^2$ g$^{-1}$; wherein the $V_2O_5$ nanosheet comprises a plurality of crystalline domains.

In another aspect, a method of forming polycrystalline $V_2O_5$ nanosheets is provided. In one embodiment, the method includes the steps of:
  (a) providing a $V_2O_5$ gel;
  (b) freezing the $V_2O_5$ gel to provide a pre-frozen $V_2O_5$ gel;
  (c) lyophilizing the pre-frozen $V_2O_5$ gel to provide lyophilized $V_2O_5$; and
  (d) annealing the lyophilized $V_2O_5$ to provide polycrystalline $V_2O_5$ nanosheets.

In another aspect, a battery is provided comprising a cathode comprising a $V_2O_5$ nanosheet as disclosed herein.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 2A-2D. Low- (FIG. 2A) and high-magnification (FIG. 2B) FESEM images of a $V_2O_5$ nanosheet; FIG. 2C: TEM image of a $V_2O_5$ nanosheet; FIG. 2D: high resolution TEM (HRTEM) image of an area of FIG. 2C.

FIG. 3A: XRD pattern of leaf-like $V_2O_5$ nanosheets. The vertical lines on the x-axis correspond to the standard XRD reflections of orthorhombic $V_2O_5$ and the inset shows crystalline structure of layered $V_2O_5$. FIG. 3B: $N_2$ adsorption/desorption isotherm and corresponding BJH pore-size distribution curves (inset) of leaf-like $V_2O_5$ nanosheets.

FIG. 4A: CV curves of the first two cycles of leaf-like $V_2O_5$ nanosheet electrodes at a scan rate of 0.2 mV s$^{-1}$. FIG. 4B: Discharge capacities of leaf-like $V_2O_5$ nanosheet electrodes at various current densities. FIG. 4C: Charge/discharge curves of leaf-like $V_2O_5$ nanosheet electrodes at various current densities. FIG. 4D: Cycling performance of leaf-like $V_2O_5$ nanosheet electrodes at a current density of 500 mA g$^{-1}$. Inset shows the charge/discharge curves corresponding to different cycles.

FIG. 5A: Nyquist plots of leaf-like $V_2O_5$ nanosheet electrodes measured at various depths of discharge (DOD). FIG. 5B: The calculated $R_{sf}+R_{ct}$ values at the different depth of discharge states.

DETAILED DESCRIPTION

Figure 1:
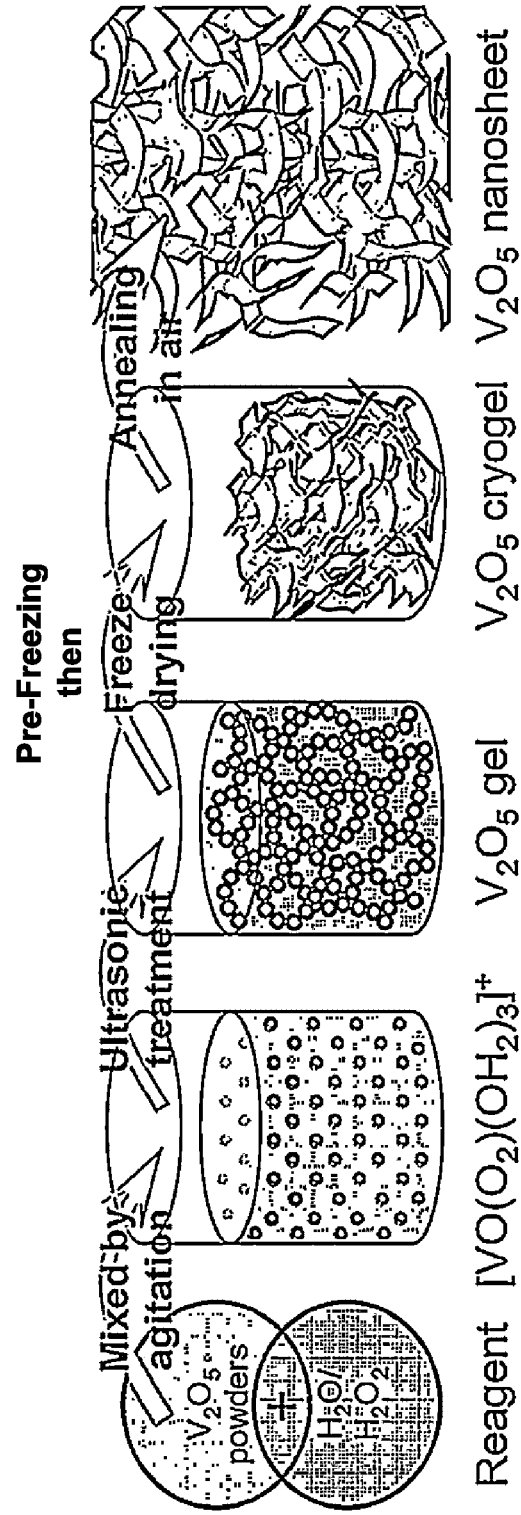
FIG. 1. A schematic illustration of the synthesis route of 2D leaf-like $V_2O_5$ nanosheets according to the disclosed embodiments.

Improved $V_2O_5$ materials are disclosed herein in the form of 2D leaf-like nanosheets. Methods of forming the $V_2O_5$ nanosheets and batteries (e.g., lithium-ion) incorporating the $V_2O_5$ nanosheets are also provided.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless.

As used herein and unless otherwise indicated, the terms "a" and "an" are taken to mean "one", "at least one" or "one or more". Unless otherwise required by context, singular terms used herein shall include pluralities and plural terms shall include the singular.

$V_2O_5$ Nanosheets

In one aspect, a $V_2O_5$ nanosheet is provided having a thickness of from about 3 nm to 1000 nm and a specific surface area of from about 1 m$^2$ g$^{-1}$ to about 500 m$^2$ g$^{-1}$; wherein the $V_2O_5$ nanosheet comprises a plurality of crystalline domains.

The nanosheets are referred to herein as "2D" and/or "leaf-like" due to their unusual shape in the form of sheets. The nanosheets are not formed from a single crystalline domain, but are polycrystalline. This polycrystallinity results from the formation of the nanosheets from annealed aggregates of nanoribbons or nanorods of $V_2O_5$.

The form of $V_2O_5$ as nanosheets is beneficial to their use as electrode material (e.g., as cathodes in LIBs). Particularly, the nanosheets provide large surface area, but are thin enough to permit transfer of ions through the sheet. The polycrystalline nature of the nanosheets enhances the ion permeability by providing a looser packing of the $V_2O_5$ lattice compared to a single-crystalline material.

In one embodiment, the $V_2O_5$ nanosheets have a thickness of from about 3 nm to 1000 nm. In one embodiment, the $V_2O_5$ nanosheets have a thickness of from about 3 nm to 100 nm. In one embodiment, the $V_2O_5$ nanosheets have a thickness of from about 60 nm to 80 nm. The thickness of $V_2O_5$ can be controlled by tuning the concentration of the $V_2O_5$ sol. The higher concentration of the $V_2O_5$ sol during synthesis, the thicker the $V_2O_5$ nanosheets.

As noted above, the relatively thin nanosheets provide high surface area but facilitate ion transfer across the thickness of the sheet, which provides benefits when incorporated into LIBs.

In one embodiment, the nanosheets have a specific surface area of from about 1 m$^2$ g$^{-1}$ to about 500 m$^2$ g$^{-1}$. In one embodiment, the nanosheets have a specific surface area of from about 25 m$^2$ g$^{-1}$ to about 30 m$^2$ g$^{-1}$. Specific surface area can be obtained through Brunauer-Emmett-Teller (BET) testing. The specific surface area is an important characteristic for LIB electrode materials because it determines the contact area between an active material and an electrolyte in a LIBs; and it determines the number of reaction sites of lithium ion intercalation/deintercalations. The large specific surface area also determines the surface energy and, thus, affects the phase transition involved with lithium ion intercalation/deintercalation process In one embodiment, the plurality of crystalline domains are orthorhombic. The orthorhombic phase of $V_2O_5$ is preferred because batteries formed using orthorhombic $V_2O_5$ nanosheets have extraordinarily high energy density, power density, and capacity.

In one embodiment, the plurality of crystalline domains comprise $V_2O_5$ nanorods. The nanosheet structure include nanorod-shaped sub-domains due to the method of fabrication, as discussed below. The nanorod shape of the $V_2O_5$ sub-domains provides the basis for the polycrystallinity of the nanosheets that results in the extraordinary properties of the provided nanosheets.

In one embodiment, the nanosheet has a power density from about 20 W kg$^{-1}$ to 16,000 W kg$^{-1}$. In one embodiment, the nanosheet has a power density from about 100 W kg$^{-1}$ to 8500 W kg$^{-1}$.

In one embodiment, the nanosheet has an energy density from about 50 Wh kg$^{-1}$ to 1500 Wh kg$^{-1}$. In one embodiment, the nanosheet has an energy density from about 200 Wh kg$^{-1}$ to 900 Wh kg$^{-1}$.

Figure 8:
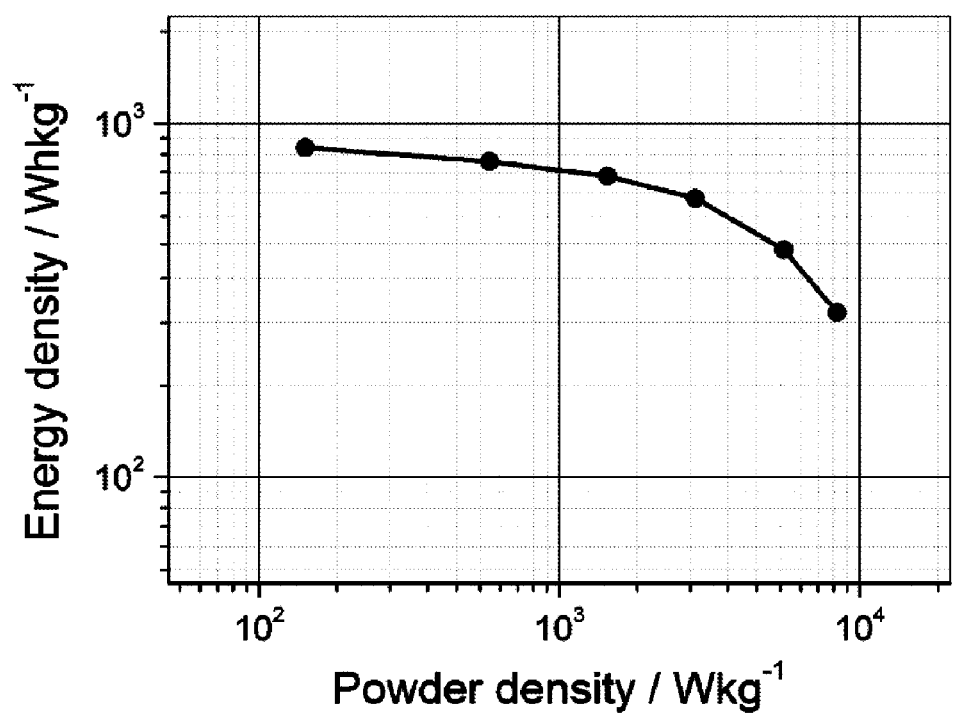
FIG. 8. Ragone plot of 2D leaf-like $V_2O_5$ nanosheet electrodes.

FIG. 8 is a Regone plot that illustrates exemplary energy and power density data obtained from nanosheets in accordance with the disclosed embodiments. See the EXAMPLES below for a further discussion of FIG. 8.

In one embodiment, the nanosheet further includes a continuous carbon network throughout the nanosheet. The carbon coating is very thin, with a thickness of 0.5 nm to 20 nm. The carbon coatings are either nanocrystalline or amorphous, and either dense or porous. By incorporating a continuous carbon network into the nanosheet, the electrochemical performance of the nanosheets can be improved. The continuous carbon network of the $V_2O_5$ nanosheet can improve the electrical conductivity of $V_2O_5$ and affect the thermodynamics and enhance the kinetics of lithium insertion/extraction in LIBs. In addition, the continuous carbon network can also increase the stability of the $V_2O_5$ material by reducing the surface reactions of $V_2O_5$ with the electrolyte and accommodating volume variation during charge-discharge cycling.

In one embodiment, the nanosheet further includes a dopant selected from the group consisting of Mn, Fe, Ni, Co, Cr, Ag, Ti, Zn, Sn, Cu, Al, K, Mg, Ca, B, Bi, and combinations thereof. Such dopants can be added to the gel so as to improve the performance of the eventual orthorhombic $V_2O_5$ film formed. Dopants may improve the characteristics of the $V_2O_5$ films in a number of ways. First, dopants can improve electrical conductivity, such that doped films have improved Li-ion intercalation properties, such as rate capability and cyclic stability. Second, dopants can serve as nucleation sites that facilitate film formation during electrodeposition. Third, dopants can impede crystallite growth during annealing, such that the crystallite size of doped films can be smaller than undoped films. Fourth, dopants will facilitate the phase transition during lithium ion intercalation and deintercalation, and thus enhance energy storage capacity. Finally, the incorporation of appropriate dopants can improve the cyclic stability.

In another aspect, a battery is provided comprising a cathode comprising a $V_2O_5$ nanosheet as disclosed herein. In one embodiment, the battery is a lithium ion battery. The integration of materials such as the nanosheets into batteries as cathode materials is well known to those of skill in the art. An exemplary LIB is fabricated and characterized in the EXAMPLES section below.

$V_2O_5$ Nanosheet Fabrication Method

In one aspect, a method of forming polycrystalline $V_2O_5$ nanosheets is provided. In one embodiment, the method includes the steps of:

(a) providing a $V_2O_5$ gel;
(b) freezing the $V_2O_5$ gel to provide a pre-frozen $V_2O_5$ gel;
(c) lyophilizing the pre-frozen $V_2O_5$ gel to provide lyophilized $V_2O_5$; and
(d) annealing the lyophilized $V_2O_5$ to provide polycrystalline $V_2O_5$ nanosheets.

The method is a simple, green approach to $V_2O_5$ nanosheet growth, as illustrated in FIG. 1. The method begins with the step of providing a $V_2O_5$ gel. Methods of forming such gels are known to those of skill in the art. An exemplary method of providing a $V_2O_5$ gel is to combine a $V_2O_5$ powder (e.g., commercially available) that is reacted with $H_2O_2$ in combination with ultrasonic treatment to generate the $V_2O_5$ gel.

The method continues with a step of freezing the $V_2O_5$ gel to provide a pre-frozen $V_2O_5$ gel. The freezing step does not take place under vacuum and is referred to as "pre-freezing" because it precedes the lyophilizing (freeze-drying) step. The freezing step is performed at a sufficiently low temperature and for a sufficient amount of time so as to freeze the $V_2O_5$ gel. In one embodiment, the freezing step lasts at least one day at $-20°$ C.

The method continues with a step of lyophilizing the pre-frozen $V_2O_5$ gel to provide lyophilized $V_2O_5$. The time, temperature, and vacuum of this step are sufficient to lyophilize the pre-frozen $V_2O_5$ gel. In one embodiment, the lyophilizing step is a temperature of $-50°$ C. or less and a vacuum of 0.1 Torr or less.

The method concludes with a step of annealing the lyophilized $V_2O_5$ to provide polycrystalline $V_2O_5$ nanosheets. In one embodiment, annealing comprises heating to a temperature of at least 350° C. If the annealing temperature is below 350° C., pure orthorhombic phase $V_2O_5$ cannot be obtained.

In one embodiment, the $V_2O_5$ gel comprises a dopant selected from the group consisting of Mn, Fe, Ni, Co, Cr, Ag, Ti, Zn, Sn, Cu, Al, K, Mg, Ca, B, Bi, and combinations thereof. Accordingly, an additional step of the method is to provide a dopant to the $V_2O_5$ gel. As noted previously, dopants can be used to provide additional properties (e.g., conductivity).

In one embodiment, providing the $V_2O_5$ gel comprises sonicating a solution of hydrogen peroxide and $V_2O_5$ powder. In one embodiment, the $V_2O_5$ powder and the hydrogen peroxide are present to provide a ratio of $n(H_2O_2):n(V)$ of about 8:1.

In one embodiment, the annealing step is performed in an atmosphere selected from the group consisting of air, oxygen, nitrogen, carbon monoxide, carbon dioxide, argon, and combinations thereof. This treatment can be used to tailor the valence state of the vanadium ions and oxygen vacancies in the final $V_2O_5$ nanosheets. For example, when annealed in air, very little $V^{4+}$ can be retained in the final $V_2O_5$ nanosheets because most of the $V^{4+}$ is oxidized during the process of annealing. When annealed in oxygen free atmosphere (nitrogen), most of the $V^{4+}$ and oxygen vacancies in cryogel can be retained in the final $V_2O_5$ nanosheets. When annealed in reducing atmosphere (carbon monoxide), more $V^{4+}$ and/or $V^{3+}$ will be generated in the $V_2O_5$ nanosheets. This low valence state vanadium ions and the accompanied oxygen vacancies play very important roles in modifying lithium-ion storage capability and electron conductivity of the $V_2O_5$.

In one embodiment, the method further includes a step of adding a carbon source to the solution and performing the annealing step in an oxygen-free atmosphere to provide polycrystalline $V_2O_5$ nanosheets with a continuous carbon network throughout the nanosheets. During the sol-gel process, carbon sources (organic molecules, such as glucose) can be introduced. In the following annealing process in oxygen free atmosphere, organic molecules will be decomposed and produce carbon coatings on the surface of $V_2O_5$ nanosheets. Because $V_2O_5$ is a poor electron conductor, the electrochemical performance of $V_2O_5$ nanosheets could be significantly improved by carbon coatings. The carbon coating is very thin, with a thickness of 0.5 nm to 20 nm. The carbon coatings are either nanocrystalline or amorphous, and either dense or porous.

The following examples are intended to illustrate, and not limit, the embodiments disclosed herein.

EXAMPLES

2D Leaf-Like $V_2O_5$ Nanosheets

The method of forming the nanosheets is a simple, green approach, as illustrated in FIG. 1. The method begins with a $V_2O_5$ powder (e.g., commercially available) that is reacted with $H_2O_2$ in combination with ultrasonic treatment to generate $V_2O_5$ gel.

The $V_2O_5$ gel is optionally diluted, frozen, lyophilized (i.e., freeze-dried), and annealed to obtain $V_2O_5$ nanosheets. A comprehensive description of the exemplary method is described below in the Experimental section. The low-cost raw materials (commercial $V_2O_5$ powder and $H_2O_2$ can be used) and facile experimental procedures favorably enable the method suitable for large-scale production.

FIGS. 2A-2D present FESEM and TEM images of the $V_2O_5$ nanosheets annealed at 450° C. for 1 h in air. It can be clearly seen that the prepared $V_2O_5$ has a large-area 2D leaf-like structure (FIG. 2A). The thickness of the $V_2O_5$ nanosheets is 60-80 nm (FIG. 2B). To the best of our knowledge, this is the first time that such large-area 2D leaf-like $V_2O_5$ nanosheets have been obtained. From the SEM image shown in FIG. 2B, one can find that the $V_2O_5$ nanosheet actually is polycrystalline and consists of small nanorods. The TEM image (FIG. 2C) further confirms the 2D sheet structure of the prepared $V_2O_5$. The high resolution (HR) TEM image (FIG. 2D) of the $V_2O_5$ nanosheet displays clear lattice fringes with a spacing of 0.26 nm and is indexed to the (310) planes of orthogonal $V_2O_5$ (JCPDS card No. 41-1426).

Figure 6A:
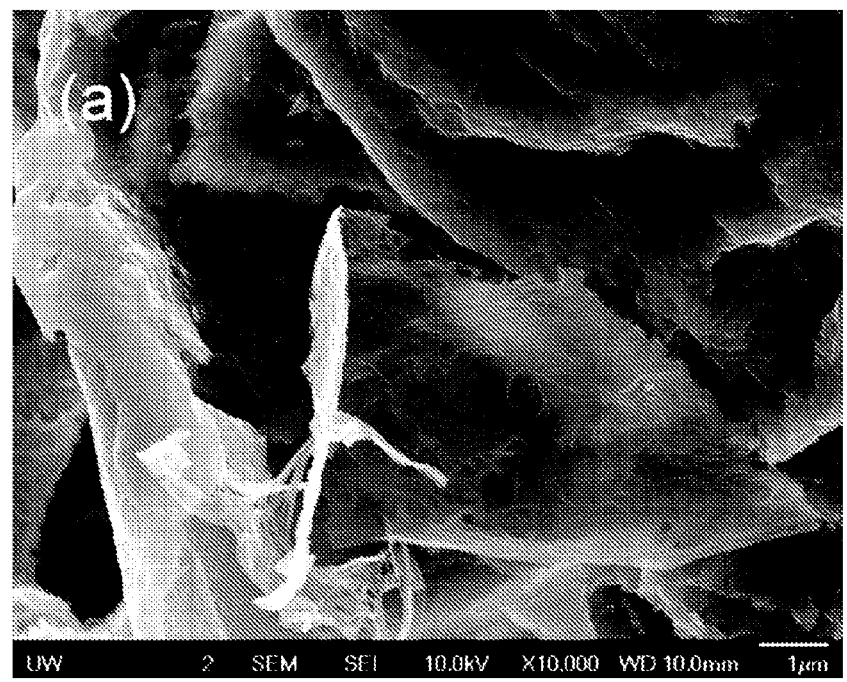
FIGS. 6A and 6B. Low- (FIG. 6A) and high-magnification (FIG. 6B) FESEM images of $V_2O_5$ nanosheets.
Figure 6B:
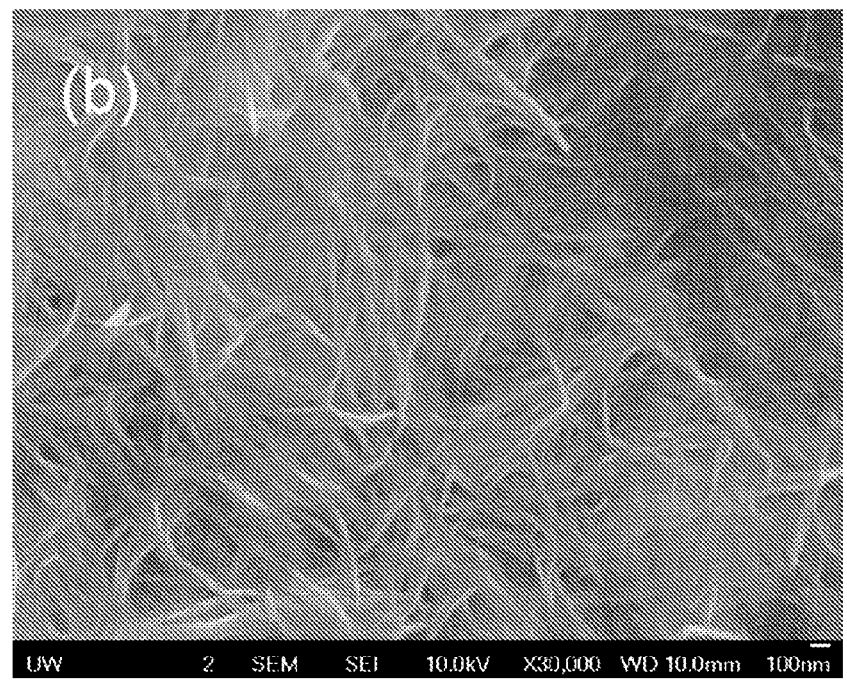
Figure 7:
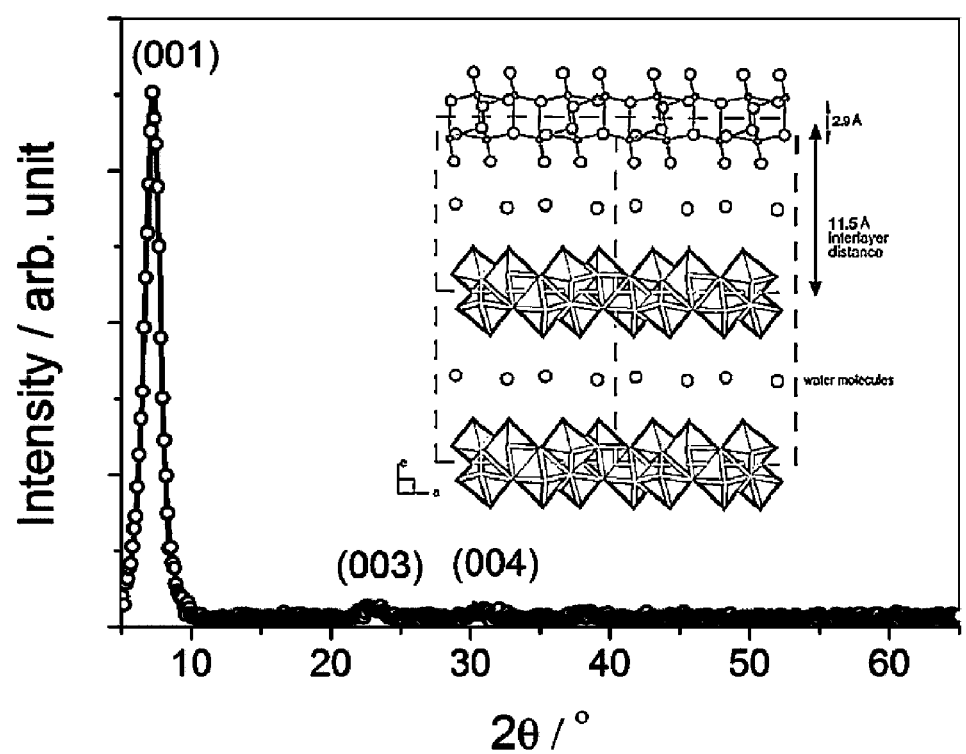
FIG. 7. XRD pattern of $V_2O_5$ nanosheets.

Without being bound by theory, the mechanism for the formation of this 2D $V_2O_5$ nanosheet can be described as follows. During the process of freeze drying, the ribbon-like $V_2O_5$ fibers intertwine into sheets $V_2O_5$ during the removal of solvent from the $V_2O_5$ gel. The freeze-dried $V_2O_5$ cryogel consists of long nanobelts that are less than 100 nm wide (FIGS. 6A and 6B). The nanobelt morphology could be related to the formation of hydrous $V_2O_5$ as previously reported in the literature, and this is in good agreement with the XRD diffraction results (FIG. 7). When the $V_2O_5$ cryogel was annealed in air at 450° C., the hydrous $V_2O_5$ nanobelts grew into small nanorods and formed orthorhombic leaf-like $V_2O_5$ nanosheets.

Figure 3A:
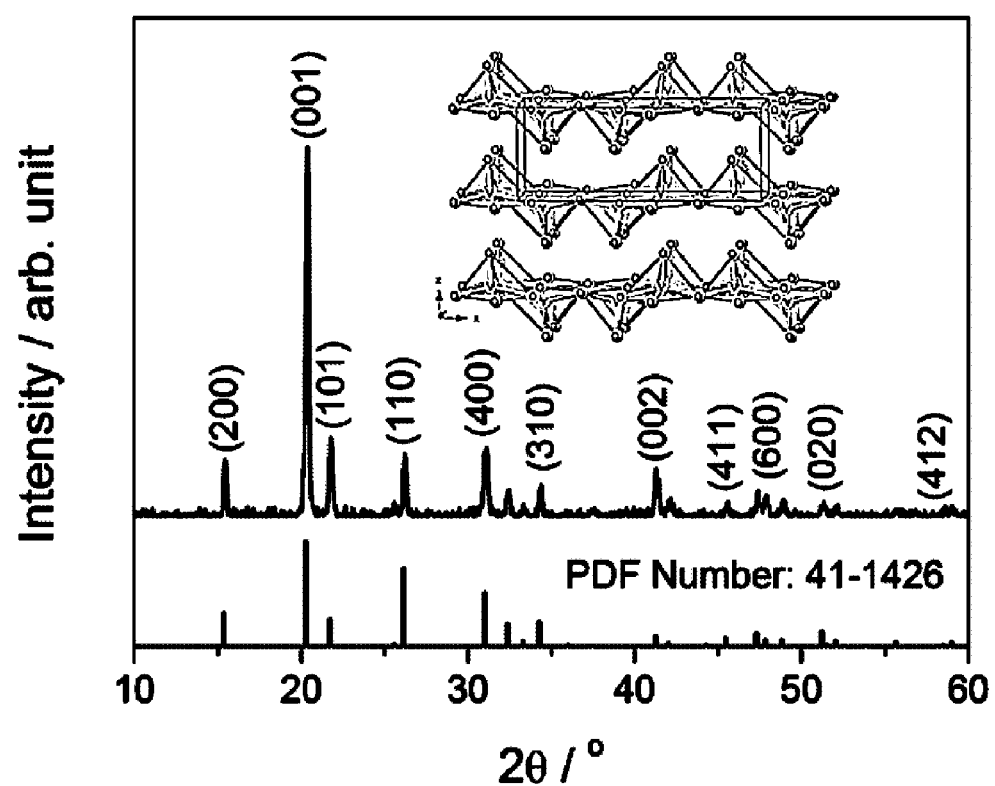
FIGS. 3A and 3B.
Figure 3B:
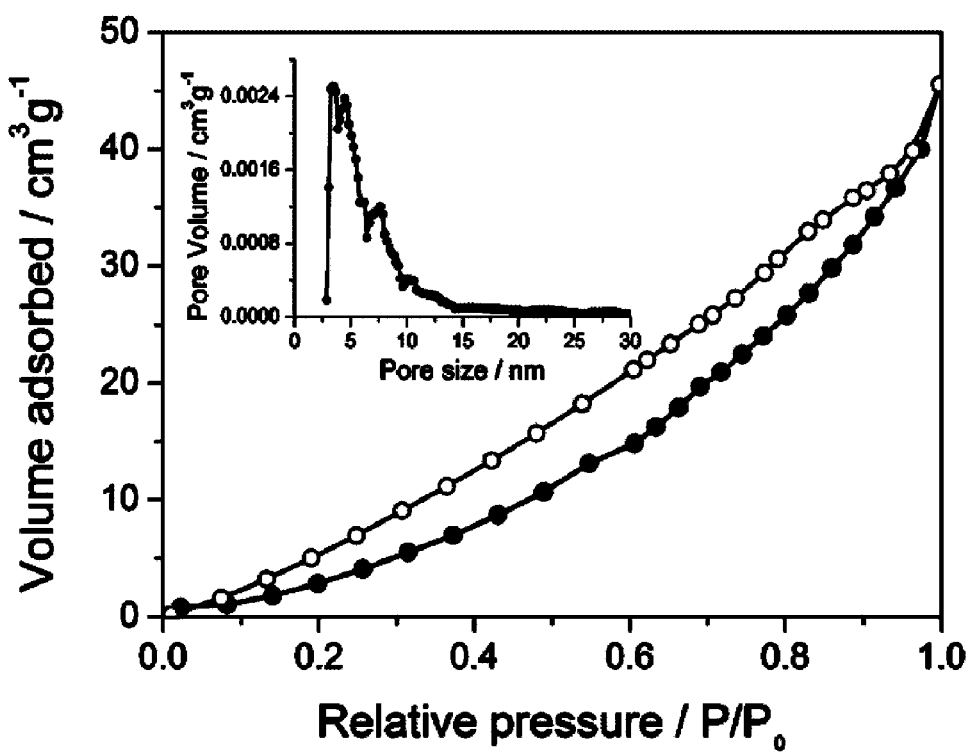

FIG. 3A shows the XRD pattern of the $V_2O_5$ nanosheets annealed at 450° C. for 1 h in air. All diffraction peaks can be indexed to an orthorhombic phase $V_2O_5$ (JCPDS card No. 41-1426) with the lattice parameters of a=11.488 Å, b=3.559 Å, c=4.364 Å, agreeing well with literature values. No secondary phase was observed. The orthorhombic phase $V_2O_5$ has a layered structure consisting of $V_2O_5$ layers stacking along the c-axis (inset of FIG. 3A). Nitrogen adsorption/desorption isotherm measurements were carried out and the results are shown in FIG. 3B. The Barrett-Joyner-Halenda (BJH) pore size distribution obtained from the isotherm revealed that the sample contains relatively mesoscale pores. The Brunauer-Emmett-Teller (BET) specific surface area has been estimated to be 28 $m^2$ $g^{-1}$.

Figure 4A:
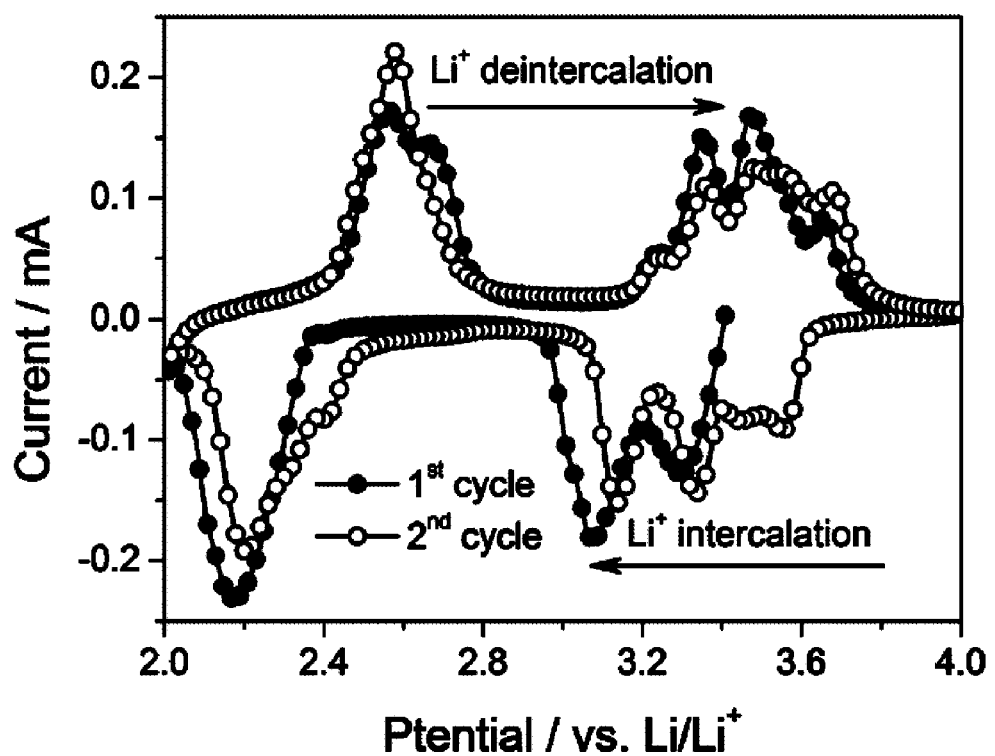
FIGS. 4A-4D.
Figure 4B:
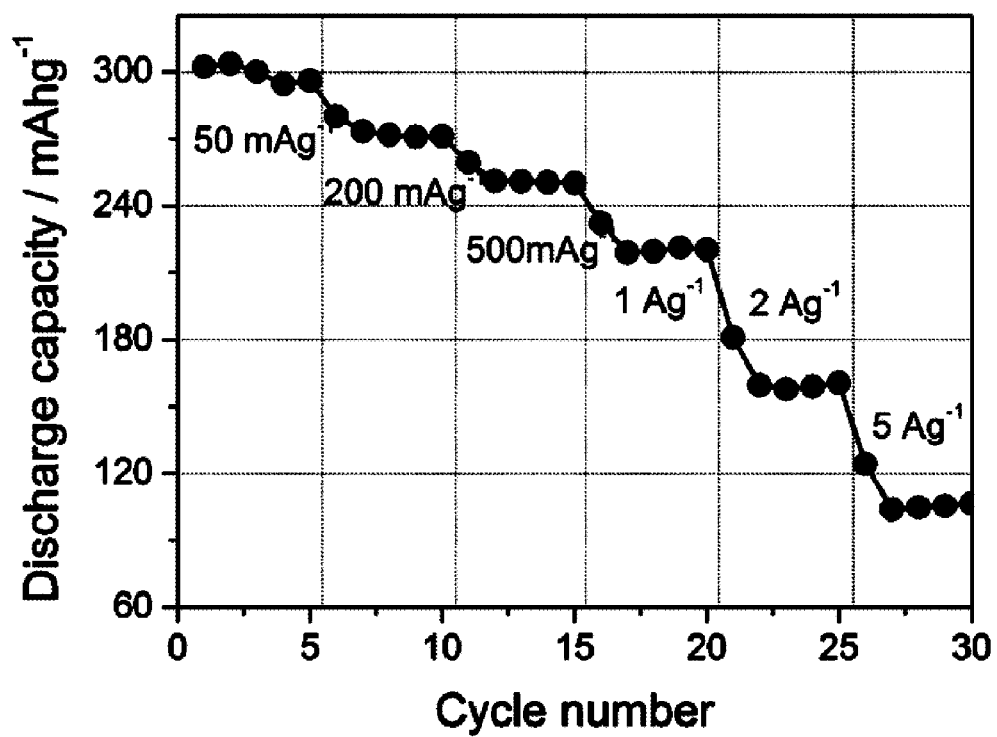

FIG. 4A presents the cyclic voltammetry (CV) profiles of 2D leaf-like $V_2O_5$ nanosheet electrodes for the first two cycles at a scan rate of 0.2 mV $s^{-1}$. In the first cycle, the three intensive reduction peaks located at 3.30, 3.08, and 2.17V, corresponding to the phase transitions α/ε, ε/δ, and δ/γ, respectively. Three obvious oxidation peaks appeared during anodic scanning, at 2.57, 3.35, and 3.48 V, respectively. An additional cathodic peak observed in the high potential region (at 3.56 V) could be ascribed to the irreversible phase transition of the γ/γ' system. The symmetrical features of the CV curve suggest good reversibility of the cycling process. FIG. 4B gives the cycling response of 2D leaf-like $V_2O_5$ nanosheet electrodes at various charge/discharge current densities. The discharge capacities measured in the voltage window from 2.0 V to 4.0 V are 303, 273, 251, 219, and 160 mA h $g^{-1}$ at current densities of 50, 200, 500, 1000, and 2000 mA h $g^{-1}$, respectively. Even at a very high current density of 5000 mA $g^{-1}$, the 2D leaf-like $V_2O_5$ nanosheet electrode can still deliver high capacity of 104 mA h $g^{-1}$. Note that this rate capability is better than those of carbon-coated $V_2O_5$ and other $V_2O_5$ nanostructured electrodes reported in literature to date (Table 1).

TABLE 1

A comparison of C-rate results between electrodes of the present disclosure ("Exemplary Electrodes") and other reported $V_2O_5$ based electrodes. All data are second discharge capacities.

| | Samples discharge capacity/mAh $g^{-1}$ | | | | | |
|---|---|---|---|---|---|---|
| Current density | Exemplary Electrodes | Ref. 1 | Ref. 2 | Ref. 3 | Ref. 4 | Ref. 5 |
| 50 mA $g^{-1}$ | 303 | 250 | | | | |
| 120 mA $g^{-1}$ | | | 261 | | | |
| 200 mA $g^{-1}$ | 273 | | | | | |
| 500 mA $g^{-1}$ | 251 | 140 | | | | |
| 580 mA $g^{-1}$ | | | | 135 | | |
| 735 mA $g^{-1}$ | | | | | 146 | |
| 1000 mA $g^{-1}$ | 219 | | | | | 190 |
| 1764 mA $g^{-1}$ | | | | 103 | | |
| 2000 mA $g^{-1}$ | 160 | | | | | 150 |

Ref. 1: J. Liu, H. Xia, D. Xue, L. Lu, *J. Am. Chem. Soc.* 2009, 131, 12086-12087.
Ref. 2: A. Sakunthala, M. V. Reddy, S. Selvasekarapandian, B. V. R. Chowdari, P. Christopher Selvin, *Energy Environ. Sci.* 2011, 4, 1712-1725.
Ref. 3: J. Liu, Y. Zhou, J. Wang, Y. Pan, D. Xue, *Chem. Commun.* 2011, 47, 10380-10382.
Ref. 4: S. Wang, Z. Lu, D. Wang, C. Li, C. Chen, Y. Yin, *J. Mater. Chem.* 2011, 21, 6363-6369.
Ref. 5: Y. Wang, H. J. Zhang, K. W. Siah, C. C. Wong, J. Lin, A. Borgna, *J. Mater. Chem.* 2011, 21, 10336-10341.

Figure 4C:
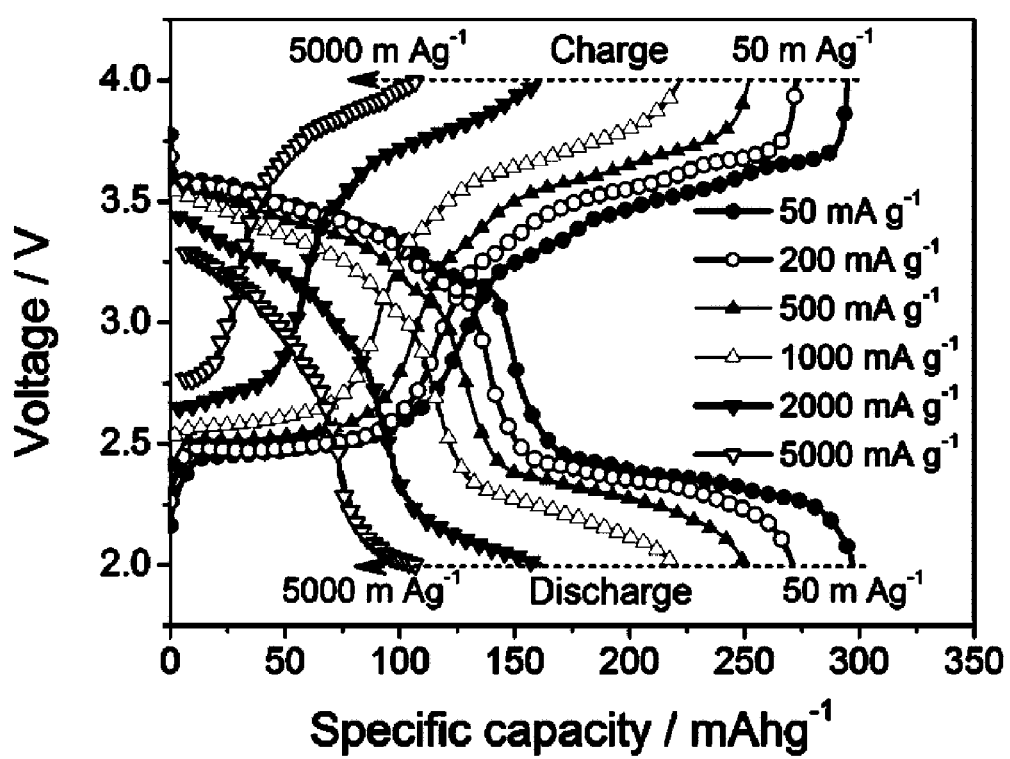
Figure 4D:
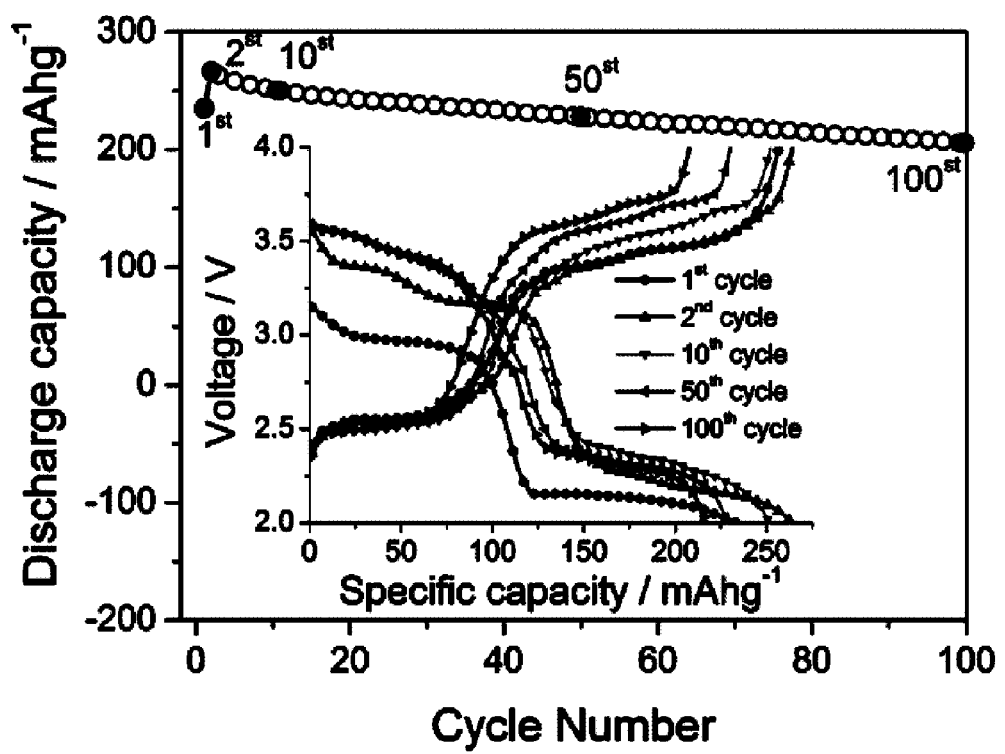

The results described in the present disclosure show that the 2D leaf-like $V_2O_5$ nanosheet structure favorably reduces the diffusion length for lithium ions and enables high-rate performance of LIBs. With the charge/discharge current density increasing from 50 to 5000 mA $g^{-1}$, the powder density increases from 142 W $kg^{-1}$ to 8410 W $kg^{-1}$ (FIG. 8). These compare to supercapacitors, which are addressing the extremes of power-density needs (~1000-20000 W $kg^{-1}$) of commercially available devices, though their energy density is only about 1-20 Wh $kg^{-1}$. The 2D leaf-like $V_2O_5$ nanosheets may be used for novel and superior electrochemical energy-storage devices with both high-power and high-energy densities. FIG. 4C presents the charge/discharge curves of the 2D leaf-like $V_2O_5$ nanosheet electrodes at various current densities in the range 2.0-4.0 V. Reversible plateau regions can be observed at all the current densities. The discharge/charge plateaus agree well with the redox peaks shown in the CV curve of FIG. 4A. With an increase in current density, especially at very high current densities (2000 and 5000 mA $g^{-1}$), the discharge voltage decreases and the charge voltage increases due to an increasing polarization effect. FIG. 4D shows the cycling performance of the 2D leaf-like $V_2O_5$ nanosheet electrodes at a current density of 500 mA $g^{-1}$. After 100 cycles, a specific discharge capacity of 206 mAh $g^{-1}$ can be retained. The capacity fading rate is about 0.22% per cycle, which is lower than the results reported for this material. The 2D leaf-like $V_2O_5$ nanosheet electrodes maintained a well-defined reversible plateau region even at the $60^{th}$ cycle. It is noticeable that the capacity loss with the plateau of about 3.15 V is much larger than those of others. Therefore, it can be inferred that leaf-like $V_2O_5$ processes relatively poor reversibility for lithium ion intercalation/de-intercalation with the voltage plateau of about 3.15 V, which is considered a main reason for capacity fading. The excellent high-rate performance of leaf-like $V_2O_5$ nanosheet electrodes is believed to be based on their unique architecture results from at least the following aspects: The large specific area of the 2D leaf-like $V_2O_5$ nanosheets facilitate the electrolyte to transport the intercalation and de-intercalation of the lithium ions; and the hierarchical porous structure of the $V_2O_5$ nanosheets relax the mechanical strain generated upon the charge/discharge cycling.

Figure 5A:
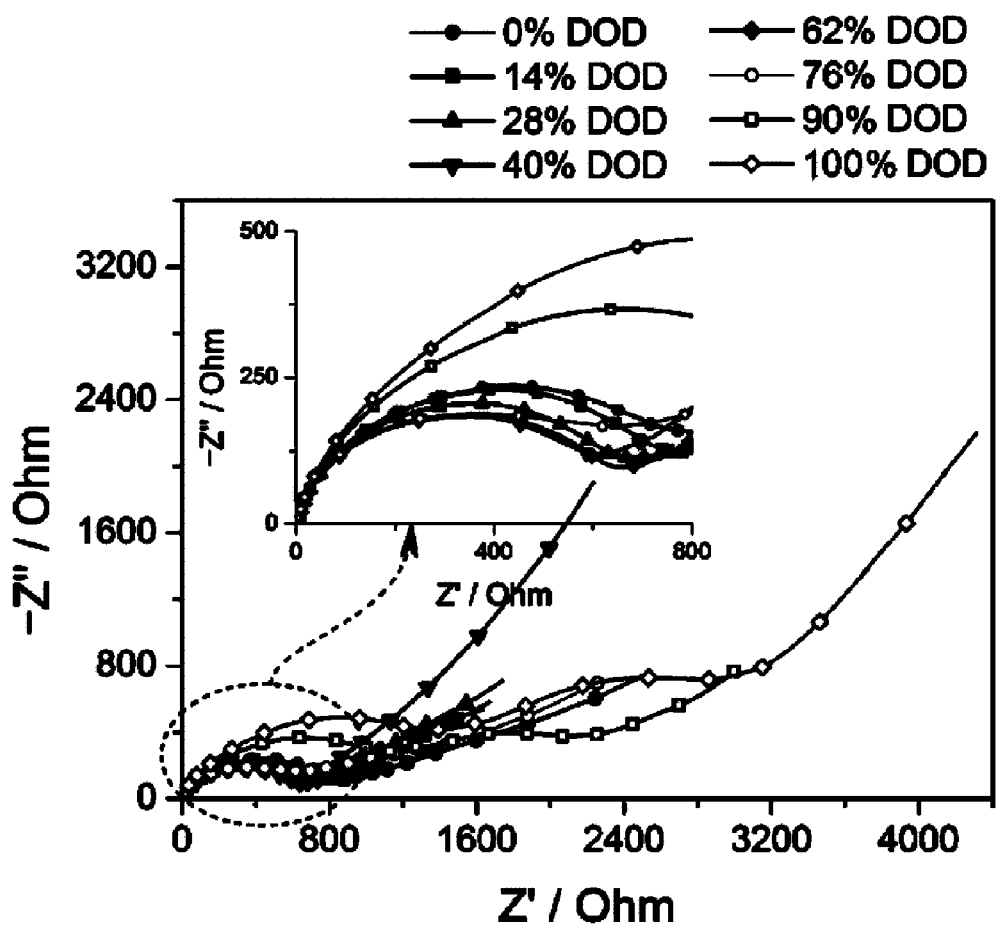
FIGS. 5A and 5B.
Figure 5B:
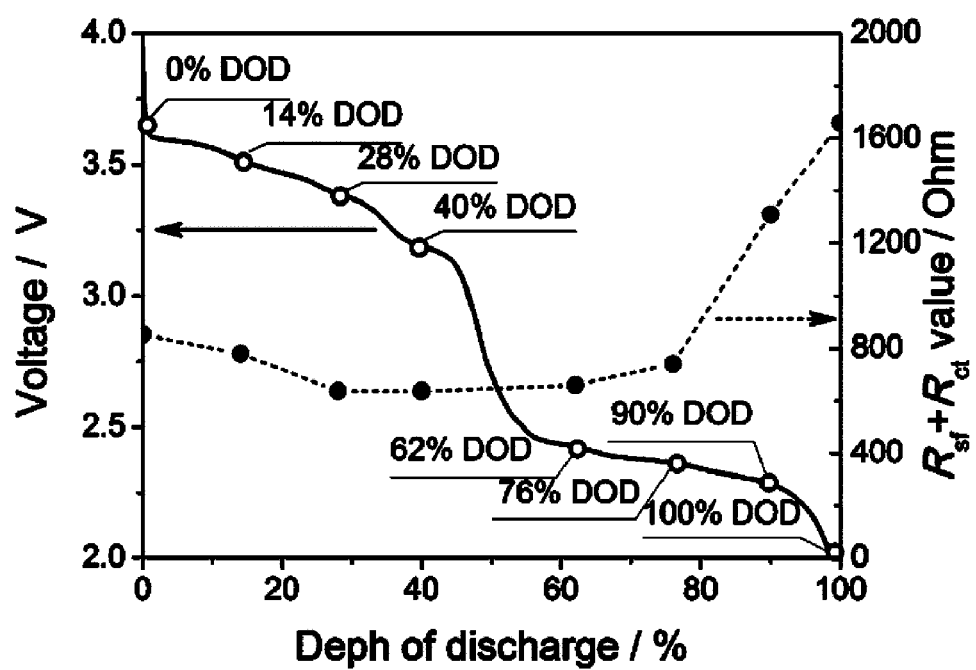

FIG. 5A provides the Nyquist plots of the 2D leaf-like $V_2O_5$ nanosheet electrode at various depth of discharge (DOD) after the electrode was activated at 20 mA $g^{-1}$ for 4 cycles. The semicircle in the high frequency region relates to the combined process of surface film ($R_{sf}$) and the charge transfer resistance ($R_{ct}$). The low frequency semicircle (for 76%, 90%, and 100% DOD) corresponds to a bulk phenomenon, which arises from electronic conductivity of active material and ionic conductivity of the electrolyte filled in the pores of composite electrode. FIG. 4B presents the calculated $R_{sf+ct}$ values (diameter of semicircle at high frequency) under various DOD states. With DOD increasing from 0% to 62%, the $R_{sf+ct}$ value initially decreases from 853Ω to 637Ω at 28% DOD and then slightly increases to 660Ω at 62% DOD. Further increasing DOD from 76% to 100% leads the $R_{sf+ct}$ value abruptly increased from 740Ω to 1660Ω. Such a large increase of $R_{sf+ct}$ value suggests that the electrochemical reaction under high DOD became much more difficult than under low DOD, due to the change of phase structure. Another important feature of the EIS plots is the appearance of bulk resistance ($R_b$, the second semicircle at low frequency, FIG. 8) under high DOD (76%, 90%, and 100% DOD) states. This suggests that under those states the electrode is a poor electronic conductor. While under low DOD (from 0% DOD to 62% DOD) states, the bulk resistance ($R_b$) is negligibly small, indicating that electrodes are good electronic conductors. This result is in good agreement with the four-probe current-voltage characteristics for $Li_xV_2O_5$ nanoribbons reported previously. Large changes in $R_b$ values have also been observed in some other cathode materials, depending on the DOD, and are attributed to reversible semiconductor-metal transformations during cycling.

In summary, we have developed a facile, green, and low-cost synthesis of 2D leaf-like $V_2O_5$ nanosheets. The unique nanoscale characteristics, including 2D morphology, hierarchical porous structure, large specific surface, of these 2D $V_2O_5$ nanosheets leads to the superior electrochemical performance in terms of their specific capacity, rate capability, and cyclability when they are used as cathode material for LIBs. The obtained excellent performance opens up new opportunities in the development of high performance next-generation LIBs.

Experimental

Material Preparation:

Vanadium pentoxide gel was prepared using a known method. In brief, $V_2O_5$ powders (99.8%, Alfa-AESAR) were added into de-ionized water and $H_2O_2$ (30 wt. % in $H_2O$, Sigma-Aldrich) to form a solution with a $V_2O_5$ concentration ($C_V$) of 0.3 M and $n(H_2O_2):n(V)$ of 8:1. The resulting solution was stirred for 15 min while kept in a water bath at a room temperature and then sonicated for 15 min for the reactions. This solution was later diluted to $C_V=0.056$ M and then sonicated for about 80 min until the solution turned into brownish red $V_2O_5$ gel. This gel was further dispersed and diluted to a $C_V$ of 0.03 M, and stirred in de-ionized water until a homogenous red-colored, viscous solution was formed. This solution was pre-frozen in a freeze refrigerator at −20° C. for 1 day and then freeze-dried under vacuum at −50° C. for 3 days in a Labconco FreeZone 1 L freeze dryer. After drying, the $V_2O_5$ cryogel was annealed in ambient atmosphere at 450° C. for 1 h to form 2D leaf-like $V_2O_5$ nanosheets.

Material Characterization:

The phase structure and morphology of the as-prepared samples were characterized by X-ray diffraction (XRD, Philips 1820 X-ray diffractometer), field emission scanning electron microscopy (FESEM, JEOL, JSM-7000), and transmission electron microscopy (TEM, Tecnai G2 F20 S-Twin). The Brunauer-Emmett-Teller (BET) specific surface areas and pore size distributions were measured with QuantaChrome NOVA 4200e analyzer (working gas $N_2$, 77 K).

Electrochemical Measurements:

The electrochemical properties of the 2D leaf-like $V_2O_5$ nanosheets were tested in coin-cells with metallic lithium as the anode and polypropylene (PP) film as separator. The coin-cells were assembled in an argon-filled glove-box. The cathodes were fabricated by mixing $V_2O_5$ nanosheets, super P carbon black, and poly(vinyldifluoride) (PVDF) at a weight ratio of 70:20:10 in n-methyl-2-pyrrolidone (NMP) solvent. The resulting mixture was then uniformly spread on an aluminum foil current collector. Finally, the electrode was dried at 80° C. for 12 h. The electrode loading was about 2 mg cm$^{-2}$. The electrolyte solution was made of 1 M $LiPF_6$ in a 1:1 (V:V) mixture of ethylene carbonate (EC) and dimethyl carbonate (DMC). The cells were galvanostatically charged and discharged under different current densities between 2.0 V and 4.0 V (vs $Li/Li^+$) using Arbin BT-2000 battery tester at room temperature. Cyclic voltammetry (CV) studies were carried out on an electrochemical workstation (CHI 605 C) between 2.0 and 4.0 V at a scan rate of 0.2 mV s$^{-1}$. Electrochemical impedance spectroscopies (EIS) were performed using the Solartron 1287A in conjunction with a Solartron 1260FRA/impedance analyzer. In EIS measurement, the frequency ranged from 100 kHz to 5 mHz and the AC amplitude was 5.0 mV.

While illustrative embodiments have been illustrated and described, it will be appreciated that various changes can be made therein without departing from the spirit and scope of the invention.

The invention claimed is:

1. A method of forming polycrystalline $V_2O_5$ nanosheets comprising the steps of:
   (a) providing a $V_2O_5$ gel by sonicating a solution of hydrogen peroxide and $V_2O_5$ powder;
   (b) freezing the $V_2O_5$ gel to provide a pre-frozen $V_2O_5$ gel;
   (c) lyophilizing the pre-frozen $V_2O_5$ gel to provide lyophilized $V_2O_5$; and
   (d) annealing the lyophilized $V_2O_5$ by heating to a temperature of at least 350° C. to provide polycrystalline $V_2O_5$ nanosheets,
   wherein the hydrogen peroxide and the $V_2O_5$ powder are present in a molar ratio of $H_2O_2:V_2O_5$ of about 16:1.

2. The method of claim 1, wherein the freezing step lasts at least one day at 20° C.

3. The method of claim 1, wherein the lyophilizing step is a temperature of 50° C. or less and a vacuum of 0.1 Torr or less.

4. The method of claim 1, wherein the annealing step is performed in an atmosphere selected from the group consisting of air, oxygen, nitrogen, carbon monoxide, carbon dioxide, argon, and combinations thereof.

5. The method of claim 1, further comprising adding a carbon source to the solution and performing the annealing step in an oxygen-free atmosphere to provide polycrystalline $V_2O_5$ nanosheets with a continuous carbon network throughout the nanosheets.

6. The method of claim 1, wherein the $V_2O_5$ gel comprises a dopant selected from the group consisting of Mn, Fe, Ni, Co, Cr, Ag, Ti, Zn, Sn, Cu, Al, K, Mg, Ca, B, Bi, and combinations thereof.

* * * * *

UNITED STATES PATENT AND TRADEMARK OFFICE
CERTIFICATE OF CORRECTION

PATENT NO. : 9,997,778 B2  
APPLICATION NO. : 14/440849  
DATED : June 12, 2018  
INVENTOR(S) : G. Cao et al.

Page 1 of 1

It is certified that error appears in the above-identified patent and that said Letters Patent is hereby corrected as shown below:

In the Claims

| Column | Line | Error |
|---|---|---|
| 10 (Claim 2, Line 2) | 38 | "20° C." should read -- –20° C.-- |
| 10 (Claim 3, Line 2) | 40 | "50° C." should read -- –50° C.-- |

Signed and Sealed this  
Sixteenth Day of July, 2019

Andrei Iancu  
*Director of the United States Patent and Trademark Office*